United States Patent
Kamada

(10) Patent No.: US 9,325,921 B2
(45) Date of Patent: Apr. 26, 2016

(54) METHOD FOR MANUFACTURING AN IMAGING APPARATUS HAVING A FRAME MEMBER COVERING A PAD

(71) Applicant: Sony Corporation, Tokyo (JP)

(72) Inventor: Yasuhiro Kamada, Kumamoto (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 14/677,781

(22) Filed: Apr. 2, 2015

(65) Prior Publication Data

US 2015/0215551 A1 Jul. 30, 2015

Related U.S. Application Data

(62) Division of application No. 13/422,915, filed on Mar. 16, 2012, now Pat. No. 9,025,079.

(30) Foreign Application Priority Data

Apr. 7, 2011 (JP) .................................. 2011-085328

(51) Int. Cl.
*H04N 5/225* (2006.01)
*H04N 5/369* (2011.01)
*H01L 27/146* (2006.01)

(52) U.S. Cl.
CPC .......... *H04N 5/369* (2013.01); *H01L 27/14618* (2013.01); *H01L 2224/4809* (2013.01); *H01L 2224/48091* (2013.01); *H01L 2224/48451* (2013.01); *H01L 2224/48463* (2013.01); *H01L 2224/49171* (2013.01); *H04N 5/2257* (2013.01)

(58) Field of Classification Search
CPC ..................... H01L 2224/48451; H04N 5/369
See application file for complete search history.

(56) References Cited

U.S. PATENT DOCUMENTS

| | | | | |
|---|---|---|---|---|
| 7,423,334 B2* | 9/2008 | Tu | ........................... | H01L 23/10 257/434 |
| 8,308,379 B2* | 11/2012 | Gooi | ...................... | G03B 17/12 359/819 |
| 2007/0253708 A1* | 11/2007 | Watanabe | .............. | G03B 17/00 396/529 |
| 2008/0252771 A1* | 10/2008 | Wu | ...................... | H04N 5/2254 348/340 |
| 2009/0153706 A1* | 6/2009 | Webster | ................. | H01L 25/16 348/294 |
| 2009/0160998 A1* | 6/2009 | Fukamachi | ............ | G02B 7/021 348/340 |
| 2012/0249822 A1* | 10/2012 | Yoshida | ............ | H01L 27/14618 348/222.1 |

* cited by examiner

*Primary Examiner* — Gary C Vieaux
(74) *Attorney, Agent, or Firm* — Sheridan Ross P.C.

(57) ABSTRACT

A solid-state imaging apparatus includes: a solid-state imaging device mounted on a substrate; a bonding wire that electrically connects a pad formed on the solid-state imaging device to a lead island formed on the substrate; a frame member that has a frame-like shape and surrounds side portions of the solid-state imaging device; and a light-transmissive optical member so accommodated in the frame member that the optical member faces an imaging surface of the solid-state imaging device, wherein the frame member has a leg portion extending from the side where the optical member is present toward the imaging surface, and the frame member is integrally fixed to the solid-state imaging device with an end of the bonding wire that is connected to the pad covered with the leg portion.

3 Claims, 14 Drawing Sheets

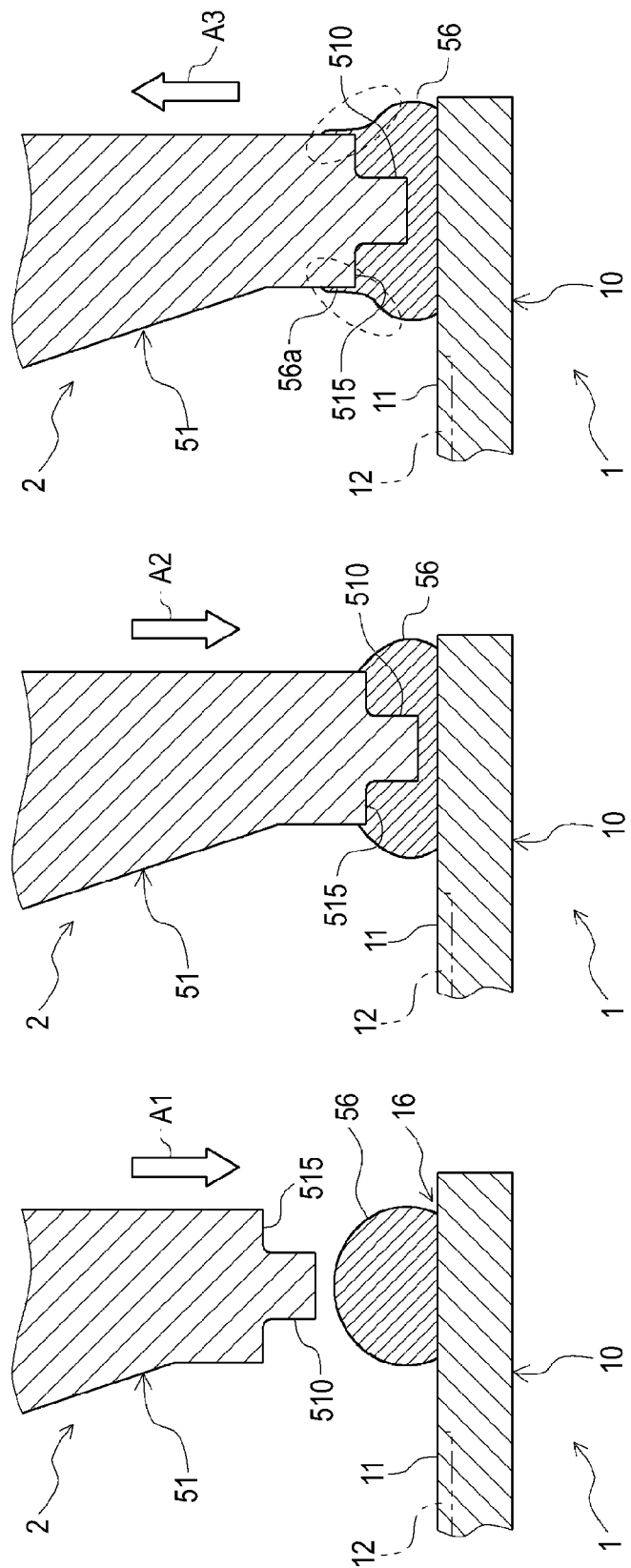

METHOD FOR MANUFACTURING AN IMAGING APPARATUS HAVING A FRAME MEMBER COVERING A PAD

CROSS-REFERENCE TO RELATED APPLICATIONS

This application is a division of U.S. patent application Ser. No. 13/422,915, filed Mar. 16, 2012, which claims priority to Japanese Patent Application No. JP 2011-085328, filed in the Japan Patent Office on Apr. 7, 2011, the entire disclosures of which are hereby incorporated herein by reference.

FIELD

The present technology relates to a solid-state imaging apparatus, a method for manufacturing the same, and an electronic system using the solid-state imaging apparatus, and particularly to the structure of a solid-state imaging apparatus.

BACKGROUND

As known solid-state imaging apparatus, there are line sensors and image sensors using a CCD (charge coupled device), a CMOS (complementary metal oxide semiconductor) device, or any other solid-state imaging device. Any of the solid-state imaging apparatus is widely used as an imaging unit in a digital video camcorder, a digital still camera, a digital camera capable of capturing both video images and still images, a mobile phone, and other electronic systems. In the present specification, digital video camcorders, digital still cameras, digital cameras capable of capturing both video images and still images are collectively called digital cameras.

A solid-state imaging apparatus of the type described above includes a sensor unit in which a solid-state imaging device is mounted on a substrate and pads on the solid-state imaging device are electrically connected to lead islands on the substrate with bonding wires. The solid-state imaging apparatus is formed by attaching a frame member that has a frame-like shape or a box-like shape with a bottom and surrounds side portions of the solid-state imaging device to the sensor unit and accommodating an optical member that guides incident light to an imaging surface of the solid-state imaging device in an upper portion of the frame member (see JP-A-2002-57311 and JP-A-2006-313868, for example). The optical member may, for example, be formed of a single lens or a plurality of lenses and an IR cutoff filter when the solid-state imaging apparatus is a camera module, whereas being formed of a cover glass plate or any other similar component when the solid-state imaging apparatus is a sensor package.

FIG. 16 is a diagrammatic cross-sectional view of a camera module (also referred to as lens module and sensor module) 600 as a typical solid-state imaging apparatus of related art used in a mobile phone, a compact digital camera, and other apparatus. The camera module 600 generally includes a sensor unit 601 and a lens unit 602, as shown in FIG. 16.

The sensor unit 601 primarily includes a solid-state imaging device 610 formed of a sensor chip, such as a CCD chip and a CMOS chip described above, a substrate 620, such as an interposer, and bonding wires 630. The solid-state imaging device 610 is mounted on the substrate 620 and fixed thereto via a die-bonding member 626. Pads 615 on the solid-state imaging device 610 are electrically connected to lead islands 625 on the substrate 620 with the bonding wires 630. The sensor unit 601 is thus formed.

The lens unit 602 is primarily formed of a frame member 650 and an optical member 660. The frame member 650 generally has a frame-like or tubular shape that is open upward and downward and surrounds the bonding wires 630. The optical member 660 is accommodated in the opening of the frame member 650. The frame member 650 (lens unit 602) is fixed to the substrate 620 by bonding the lower end of a leg portion that is part of the frame member 650 and extends downward to the upper surface of the substrate 620 but outside the connected portions of the bonding wires 630.

The optical member 660, which is so accommodated in an upper portion of the frame member 650 that the optical member 660 faces the imaging surface of the solid-state imaging device 610, transmits light incident from above (subject image) and guides it to the solid-state imaging device 610. In the present exemplary configuration, the optical member 660 includes lenses 661 (661a, 661b, and 661c) and an IR cutoff filter (hereinafter referred to as "IRCF") 662.

The lenses 661 are accommodated in a lens holder 665 and held therein and movable upward and downward by a lens drive mechanism 666 provided in the frame member 650. The lenses 661 transmit the subject image incident from above and focus it on the imaging surface of the solid-state imaging device 610.

In the thus configured camera module 600, the subject image having passed through the optical member 660 and having been focused on the imaging surface is converted by the solid-state imaging device 610 into an electric signal in a photoelectric conversion process, and the electric signal is read and outputted as an image signal via the substrate 620. In a manufacturing step of assembling the camera module 600, the lens drive mechanism 666 and the optical member 660 are assembled into the frame member 650 to form the lens unit 602, which is then assembled to the sensor unit 601.

SUMMARY

In recent years, as a digital camera has progressed in terms of compactness, high quality (large number of pixels), and functionality, a solid-state imaging apparatus incorporated in such a digital camera or any other electronic system is also strongly required to achieve compactness, high quality (large number of pixels), and high precision. Since in the configuration of a sensor package, a camera module, and a solid-state imaging apparatus of related art, since a support portion of the frame member 650 is disposed only on a peripheral portion of the substrate 620 outside the bonding wires 630, it is difficult to further reduce the size of the solid-state imaging apparatus.

On the other hand, when the size of a solid-state imaging apparatus is reduced, an output image tends to suffer from flare. A process in which flare occurs in a solid-state imaging apparatus will be described with reference to FIG. 17. FIG. 17 a descriptive diagram for describing how flare occurs and is a diagrammatic enlarged view showing a portion around one of the pads 615 on the solid-state imaging device 610 to which the corresponding one of the bonding wires 630 is connected.

As shown in FIG. 17, part of the light having passed through the lenses 661 and the IRCF 662, which form the optical member 660, is reflected off the connected end of the bonding wire 630 and incident on an imaging region (effective pixel region) 612 of the solid-state imaging device 610, resulting in flare (see arrows indicated by long dashed dotted lines and long dashed double-dotted lines). As the size of the solid-state imaging device 610 is reduced with the size of the solid-state imaging apparatus, the light having passed through the lenses 661 and the IRCF 662 tends to be reflected off the bonding wires 630 and incident on the imaging region 612 of the solid-state imaging device 610, more likely resulting in flare as described above.

FIG. 18 shows an example of flare produced and observed by the solid-state imaging device 610. In the region labeled with reference character F in FIG. 18, the white portion represents the light reflected off one of the bonding wires 630 and incident as flare on the imaging region 612.

It is therefore desirable to provide a solid-state imaging apparatus that prevents flare from occurring and allows further size reduction and a method for manufacturing the solid-state imaging apparatus. It is also desirable to provide a compact, high-quality electronic system.

An embodiment of the present technology is directed to a solid-state imaging apparatus. The solid-state imaging apparatus includes a solid-state imaging device mounted on a substrate, a bonding wire that electrically connects a pad formed on the solid-state imaging device to a lead island formed on the substrate, a frame member that has a frame-like shape and surrounds side portions of the solid-state imaging device, and a light-transmissive optical member so accommodated in the frame member that the optical member faces an imaging surface of the solid-state imaging device. The frame member has a leg portion extending from the side where the optical member is present toward the imaging surface (first leg portion 51 in specific embodiment, for example), and the frame member is integrally fixed to the solid-state imaging device with an end of the bonding wire that is connected to the pad (first end 31 in specific embodiment, for example) covered with the leg portion.

The frame member may be so fixed to the solid-state imaging device that the leg portion is bonded with an adhesive to a portion where the bonding wire is connected to the pad. The frame member may be so fixed to the solid-state imaging device that the leg portion is bonded to the imaging surface with an adhesive that covers the pad and an end of the bonding wire. In this case, at least a portion of the adhesive that covers the end of the bonding wire is preferably light-blocking.

The pad may be formed of a connected pad to which the bonding wire is connected and a non-connected pad to which the bonding wire is not connected. The frame member may have a positioning protrusion protruding from the leg portion toward the non-connected pad (second protrusion 512 in specific embodiment, for example). The frame member may be integrally fixed to the solid-state imaging device with the positioning protrusion being in contact with the non-connected pad and an end of the bonding wire covered with the leg portion.

Another embodiment of the present technology is directed to a method for manufacturing a solid-state imaging apparatus. The method for manufacturing a solid-state imaging apparatus includes providing a sensor unit in which a solid-state imaging device is mounted on a substrate and a bonding wire electrically connects a lead island formed on the substrate to a pad formed on the solid-state imaging device, covering the sensor unit with an optical unit (lens unit 2 in specific embodiment, for example) from above, the optical unit including a frame member and an optical member, the frame member having a frame-like shape that surrounds side portions of the solid-state imaging device and having a leg portion that is formed on a lower surface of the frame member and covers the pad from above (first leg portion 51 in specific embodiment, for example), the optical member being light transmissive and accommodated in the frame member, and integrally fixing the frame member to the solid-state imaging device in such a way that the optical member faces an imaging surface of the solid-state imaging device and an end of the bonding wire that is connected to the pad (first end 31 in specific embodiment, for example) is covered with the leg portion.

The method for manufacturing a solid-state imaging apparatus may be configured to include providing a sensor unit in which a solid-state imaging device is mounted on a substrate and a bonding wire electrically connects a lead island formed on the substrate to a pad formed on the solid-state imaging device, covering the sensor unit with a frame member from above, the frame member having a frame-like shape that surrounds side portions of the solid-state imaging device and having a leg portion that is formed on a lower surface of the frame member and covers the pad from above (first leg portion 51 in specific embodiment, for example), integrally fixing the frame member to the solid-state imaging device with an end of the bonding wire that is connected to the pad (first end 31 in specific embodiment, for example) covered with the leg portion, and accommodating a light-transmissive optical member in the frame member in such a way that the optical member faces an imaging surface of the solid-state imaging device.

The method for manufacturing a solid-state imaging apparatus described above may further include applying an adhesive in such a way that the end of the bonding wire that is connected to the pad is covered with the adhesive, moving the frame member downward from above the sensor unit, to which the adhesive has been applied, in such a way that the adhesive adheres to the leg portion so that the leg portion is boned to the pad to which the bonding wire has been connected, and allowing the frame member to be fixed to the solid-state imaging device with the adhesive.

The pad may be formed of a connected pad to which the bonding wire is connected and a non-connected pad to which the bonding wire is not connected. The frame member may have a positioning protrusion protruding from the leg portion toward the non-connected pad (second protrusion 512 in specific embodiment, for example). A pair of the non-connected pad and the positioning protrusion corresponding thereto may be provided at least in three positions. The frame member may be so moved downward from above the sensor unit that the frame member covers the sensor unit and the frame member is integrally fixed to the solid-state imaging device with at least three pairs of the positioning protrusion and the non-connected pad being in contact with each other.

Still another embodiment of the present technology is directed to an electronic system. The electronic system includes a solid-state imaging apparatus and a signal processing circuit that processes a signal outputted from the solid-state imaging apparatus. The solid-state imaging apparatus includes a solid-state imaging device mounted on a substrate, a bonding wire that electrically connects a pad formed on the solid-state imaging device to a lead island formed on the substrate, a frame member that has a frame-like shape and surrounds side portions of the solid-state imaging device, and a light-transmissive optical member so accommodated in the frame member that the optical member faces an imaging surface of the solid-state imaging device. The frame member has a leg portion that covers the pad from above (first leg portion 51 in specific embodiment, for example), and the frame member is integrally fixed to the solid-state imaging device with an end of the bonding wire that is connected to the pad (first end 31 in specific embodiment, for example) covered with the leg portion.

In the solid-state imaging apparatus according to the embodiment of the present technology, the leg portion of the frame member extends from the side where the optical member is present toward the imaging surface, and the frame member is integrally fixed to the solid-state imaging device with the end of the bonding wires that is connected to the pad covered with the leg portion. According to the configuration described above, light traveling from the side where the optical member is present toward the connected end of the bonding wire is blocked by the leg portion that covers the connected end from above, whereby flare resulting from light reflected off the bonding wire is suppressed. The solid-state imaging apparatus therefore prevents flare from occurring and allows further size reduction.

In the method for manufacturing a solid-state imaging apparatus according to the embodiment of the present technology, the sensor unit is covered with the optical unit (lens unit 2 in specific embodiment, for example) from above. The frame member is then integrally fixed to the solid-state imaging device with the connected end of the bonding wire covered with the leg portion of the frame member. According to the configuration described above, light traveling from the side where the optical member is present toward the connected end of the bonding wire is blocked by the leg portion that covers the connected end from above, whereby flare resulting from light reflected off the bonding wire is suppressed. The manufacturing method therefore prevents flare from occurring in the solid-state imaging apparatus and allows further size reduction thereof.

Alternatively, the sensor unit is covered with the frame member from above, and the frame member is integrally fixed to the solid-state imaging device with the connected end of the bonding wire covered with the leg portion of the frame member. According to the configuration described above, light traveling from the side where the optical member is present toward the connected end of the bonding wire is blocked by the leg portion that covers the connected end from above, whereby flare resulting from light reflected off the bonding wire is suppressed. The manufacturing method therefore prevents flare from occurring in the solid-state imaging apparatus and allows further size reduction thereof.

In the electronic system according to the embodiment of the present technology, the leg portion of the frame member in the solid-state imaging apparatus extends from the side where the optical member is present toward the imaging surface, and the frame member is integrally fixed to the solid-state imaging device with the connected end of the bonding wire covered with the leg portion. According to the configuration described above, light traveling from the side where the optical member is present toward the connected end of the bonding wire is blocked by the leg portion that covers the connected end from above, whereby flare resulting from light reflected off the bonding wire is suppressed. The electronic system using the solid-state imaging apparatus that prevents flare from occurring and allows size reduction can be compact and provide high quality.

BRIEF DESCRIPTION OF THE DRAWINGS

FIGS. 5A to 5C are descriptive diagrams for describing a method for manufacturing the solid-state imaging apparatus to which the present technology is applied;

DETAILED DESCRIPTION

Figure 1:
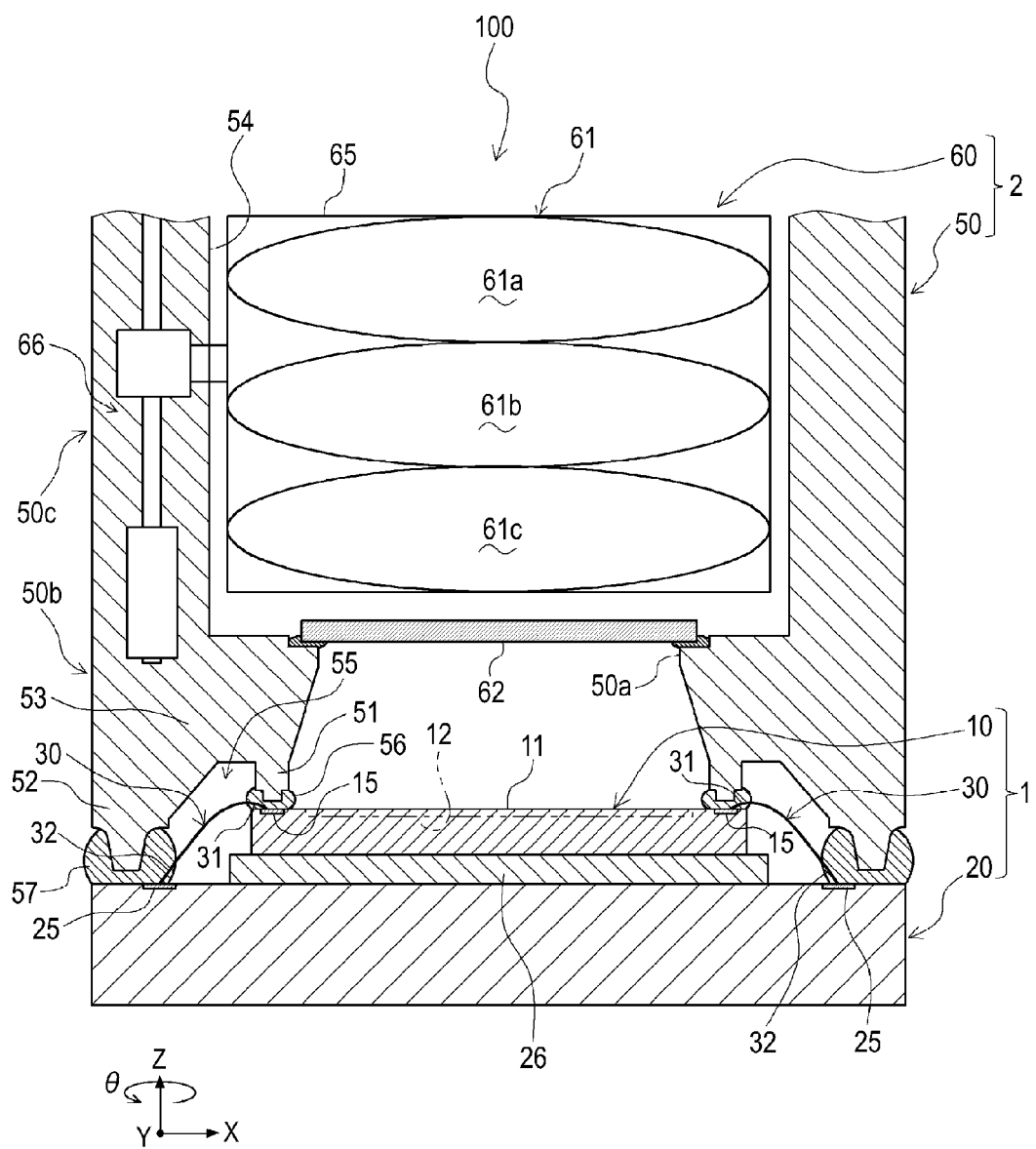
FIG. 1 is a diagrammatic cross-sectional view of a solid-state imaging apparatus to which the present technology is applied.
Figure 2:
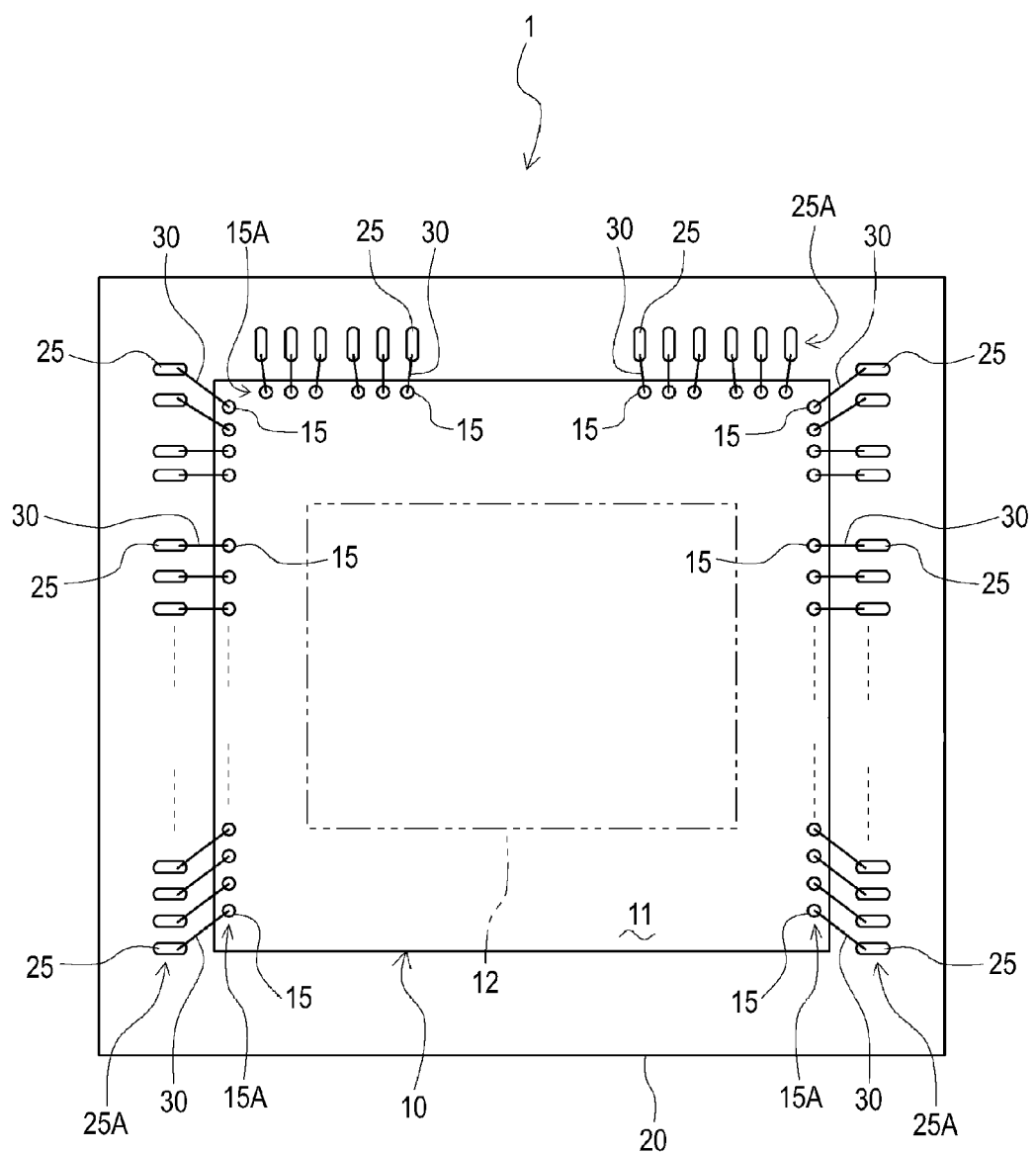
FIG. 2 is a diagrammatic plan view of a sensor unit in the solid-state imaging apparatus to which the present technology is applied.

Embodiments of the present technology will be described below. The description will be made of a case where the present technology is applied to a solid-state imaging apparatus integrated with a lens (camera module) as a representative case. FIG. 1 is a diagrammatic cross-sectional view showing a solid-state imaging apparatus 100 to which the present technology is applied. In FIG. 1, X and Z coordinate axes are added for ease of description: the direction indicated by the arrowed X axis represents rightward and the opposite direction represents leftward, and the arrowed Z axis represents upward and the opposite direction represents downward. Further, let a Y axis be the axis perpendicular to the plane of view, and the direction from the reader's side toward the side away from the reader represents backward and the opposite direction represents forward. FIG. 2 is a diagrammatic plan view (viewed from above) showing a sensor unit 1 incorporated in the solid-state imaging apparatus 100.

[Configuration of Solid-State Imaging Apparatus]

The overall configuration of the solid-state imaging apparatus 100 will first be described with reference to FIGS. 1 and 2. The solid-state imaging apparatus 100 is generally formed of a sensor unit 1 and a lens unit (optical unit) 2.

The sensor unit 1 includes a solid-state imaging device 10, a substrate 20 that holds the solid-state imaging device 10, and bonding wires 30. The bonding wires 30 electrically connect pads 15 formed on the solid-state imaging device 10 to lead islands 25 formed on the substrate 20. As described above, in the sensor unit 1 of the solid-state imaging apparatus 100 of the present embodiment, the solid-state imaging device 10 is mounted on the substrate 20, and the pads 15 formed on the solid-state imaging device 10 are electrically connected to the lead islands 25 formed on the substrate 20 with the bonding wires 30.

The solid-state imaging device 10 is a CCD chip, a CMOS chip, or any other sensor chip. In the present embodiment, the solid-state imaging device 10 is, by way of example, a rectangular-thin-plate-shaped image sensor that has a large number of pixels arranged in a matrix in the X-Y plane and produces a two-dimensional image from pixel signals detected by the pixels. The solid-state imaging device 10 is mounted on the substrate 20. An imaging region 12 formed of effective pixels is provided in a central portion of an imaging surface 11, which is the upper surface of the solid-state imaging device 10. The pads 15, which are input/output terminals through which electric power, control signals, an image signal, and other electric signals are inputted and outputted, are formed in a large number of positions in peripheral portions of the imaging surface 11 of the solid-state imaging device 10.

In the present embodiment, the large number of pads 15, 15, 15, . . . are arranged in peripheral portions along three sides (left side, right side, and back side) of the four that surround the imaging region 12, as shown in FIG. 2. The number of pads 15, the arrangement thereof, the sides along which the pads 15 are formed (one to four sides), and other configurations depend on the type of sensor (such as line sensor, image sensor, CCD, and CMOS), the number of effective pixels, the chip size, and other factors, and the present technology is applicable to any sensor configuration. In the present specification, a peripheral region 15A along the sides along which the pads 15, 15, 15, . . . are arranged is called a "pad formation region."

The substrate 20 is a circuit substrate that relays input and output signals to and from the solid-state imaging device 10. In the present embodiment, the substrate 20 is an interposer by way of example. Along peripheral portions of the upper surface of the substrate 20 that surround the solid-state imaging device 10 are arranged the lead islands 25, 25, 25, . . . in a large number of positions in correspondence with the pads 15, 15, 15, . . . formed on the solid-state imaging device 10. In the present specification, a peripheral region 25A along the sides along which the lead islands 25, 25, 25, . . . are arranged is called a "lead island formation region."

The solid-state imaging device 10 is mounted on the upper surface of the substrate 20 and fixed thereto via a die-bonding member 26. The sensor unit 1 is formed by electrically connecting the pads 15 on the solid-state imaging device 10 to the lead islands 25 on the substrate 20 with the bonding wires 30. An image processing chip or any other computation processing circuit may also be provided on the substrate 20, and an image signal outputted from the solid-state imaging device 10 may undergo image processing before outputted. In the following description, one end of each of the bonding wires 30 that is connected to the corresponding one of the pads 15 is called a first end 31, and the other end of each of the bonding wires 30 that is connected to the corresponding one of the lead islands 25 is called a second end 32 for ease of description.

The lens unit 2 is primarily formed of a frame member 50 and an optical member 60.

The frame member 50 generally has a frame-like or tubular shape that surrounds side portions of the solid-state imaging device 10, has a central opening 50a that opens upward and downward, and is divided into two portions, upper and lower portions. The lower frame-shaped portion (hereinafter referred to as "lower frame portion") 50b of the frame member 50 has a first leg portion 51 and a second leg portion 52, which will be described later in detail, so formed that they protrude downward. The upper frame-shaped portion (hereinafter referred to as "upper frame portion") 50c of the frame member 50 has an optical member accommodation portion 54 in which the optical member 60 is accommodated. The frame member 50 is made of a resin material obtained by adding carbon black or any other reflectance reducing material to a liquid crystal polymer, PEEK (polyether ether ketone), or any other suitable resin and further adding glass fibers or carbon fibers as necessary. The frame member 50 is produced by using injection molding or any other known method.

The optical member 60 is optically transmissive and so accommodated in the frame member 50 that the optical member 60 faces the imaging surface 11 of the solid-state imaging device 10. Specifically, the optical member 60 is so accommodated in the optical member accommodation portion 54 of the frame member 50 that the optical member 60 faces the imaging surface 11 of the solid-state imaging device 10. The optical member 60 forms an optical system that guides light incident from above (subject image) to the solid-state imaging device 10. The optical member 60 is formed primarily of lenses 61. In the present embodiment, the optical member 60 further includes an IR cutoff filter (hereinafter referred to as "IRCF") 62 as well as the lenses 61. As described above, the optical member 60 includes the lenses 61 that guide the incident light to the imaging surface 11 of the solid-state imaging device 10 in the present embodiment.

The lenses 61 are formed of a first lens 61a, a second lens 61b, and a third lens 61c as shown in FIG. 1 and form an optical system that focuses light incident from above to form an image (subject image) on the imaging surface 11 of the solid-state imaging device 10. The first lens 61a, the second lens 61b, and the third lens 61c are accommodated in a lens holder 65 and held therein, and the lens holder 65 is accommodated in the optical member accommodation portion 54 of the frame member 50. A lens drive mechanism 66 that moves the lenses 61 (61a, 61b, and 61c) held in the lens holder 65 is provided in the upper frame portion 50c of the frame member 50. In operation, one of the lenses 61 is moved or a plurality of the lenses 61 are moved together upward or downward.

The IRCF 62 is a filter that removes infrared light from the incident light having passed through the lenses 61. The IRCF 62 is positioned below the lens holder 65 and so bonded and fixed to the frame member 50 that the IRCF 62 blocks the opening 50a, which opens toward both the lower frame portion 50b and the upper frame portion 50c. The IRCF 62 removes infrared light from the light having passed through the lenses 61 and allows the resultant light to be focused on the imaging surface 11 of the solid-state imaging device 10, whereby a clear two-dimensional image (subject image) can be produced.

The lenses 61 and the IRCF 62 as optical elements are made, for example, of polycarbonate, PMMA (polymethyl methacrylate), or any other suitable transparent resin material, or BK7, quartz glass, or any other suitable optical glass material. The lens holder 65 is made, for example, of the same resin material as that of the frame member 50.

In a manufacturing step of assembling the solid-state imaging apparatus 100 of the present embodiment, for example, the lens drive mechanism 66 and the optical member 60 are assembled into the frame member 50 to form the lens unit 2, which is then assembled to the sensor unit 1. The solid-state imaging apparatus 100 is thus formed.

In the thus configured solid-state imaging apparatus 100, the first leg portion 51 and the second leg portion 52 of the frame member 50 extend from the side where the optical member 60 is present toward the imaging surface 11 of the solid-state imaging device 10. Specifically, the first leg portion 51 and the second leg portion 52, each of which has a tongue-like cross-sectional shape, are so formed that they protrude downward from the lower frame portion 50b of the frame member 50, and a wire accommodation portion 55, which forms an arch-shaped space, is formed between the first leg portion 51 and the second leg portion 52. The first leg portion 51 and the second leg portion 52 form a dual rectangular, frame-like shape extending in parallel to each other when viewed from below. The first leg portion 51 and the second leg portion 52 are connected to the upper frame portion 50c via a lower-frame body portion 53, which along with the first leg portion 51 and the second leg portion 52 forms the wire accommodation portion 55.

The first leg portion 51 has a rectangular frame-like shape so formed that the distance between the centers of lower end portions along the opposing sides (right and left sides, for example) of the first leg portion 51 is substantially equal to the distance between the pads 15 formed on the corresponding sides (right and left sides) of the solid-state imaging device 10 (distance between opposing portions of pad formation region 15A). The first leg portion 51 is bonded and fixed to the pad formation region 15A of the solid-state imaging device 10 with an adhesive 56 that covers the first ends 31 of the bonding wires 30 with the first ends 31 covered with the first leg portion 51. That is, the first leg portion 51 of the frame member 50, which is fixed to and supported by the pad formation region 15A of the solid-state imaging device 10, is fixed to the pad formation region 15A with the adhesive 56, into which the first ends 31 of the bonding wire 30 are buried.

The second leg portion 52 extends by the side portions of the solid-state imaging device 10 toward the substrate 20 and is bonded thereto. The second leg portion 52 has a rectangular frame-like shape so formed that the distance between the centers of lower end portions along the opposing sides of the second leg portion 52 is slightly greater than the distance between the lead islands 25, 25 along the corresponding sides of the substrate 20 (distance between opposing portions of lead island formation region 25A). That is, the second leg portion 52 is so formed that central sections of the lower end portions thereof are positioned outside the second ends 32 of the bonding wires 30, which are connected to the lead islands 25. The second leg portion 52 is bonded and fixed to the portion of the substrate 20 that is outside the lead island formation region 25A with an adhesive 57. The adhesives 56 and 57 are, for example, preferably an ultraviolet curing adhesive or a heat curing adhesive.

Figure 3:
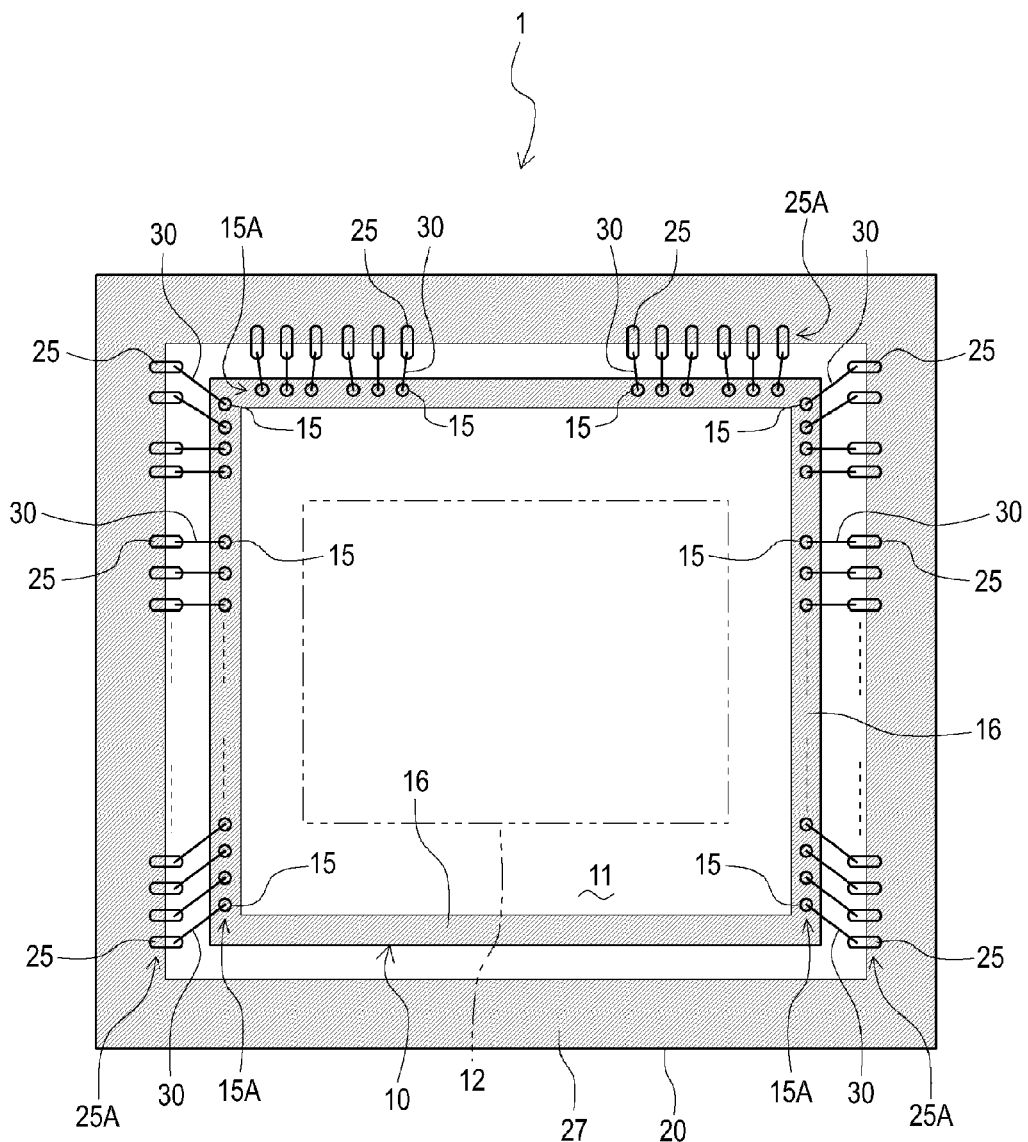
FIG. 3 is a diagrammatic plan view of the sensor unit showing regions to which a frame member is bonded in the solid-state imaging apparatus to which the present technology is applied.
Figure 4A:
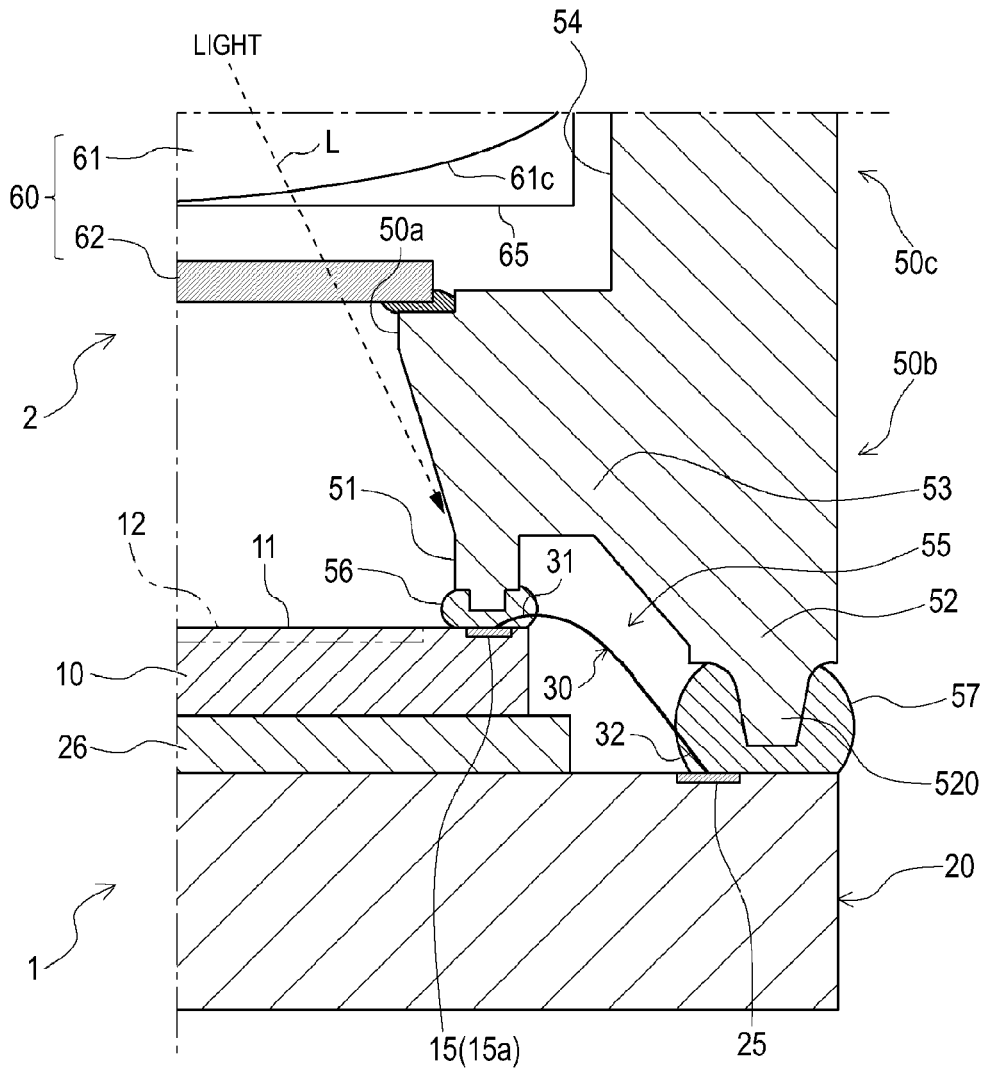
FIGS. 4A and 4B are enlarged views of portions in FIG. 1.
Figure 4B:
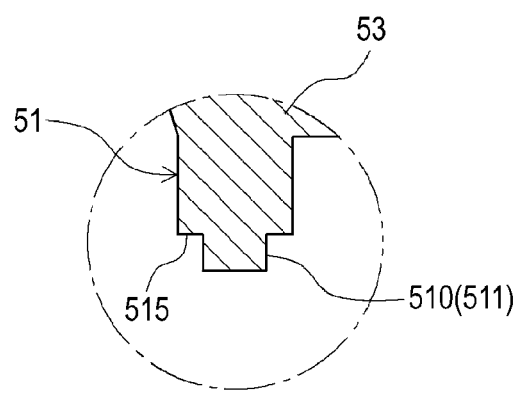

FIG. 3 is a plan view of the sensor unit 1 similar to FIG. 2 but shows a bonding region 16, to which the first leg portion 51 is bonded, and a bonding region 27, to which the second leg portion 52 is bonded. In FIG. 3, the bonding regions 16 and 27 are hatched. FIG. 4A is an enlarged view of a lower right region in FIG. 1, and FIG. 4B is an enlarged view of part of the first leg portion 51. In the present embodiment, the bonding region 16 extends along the four sides of the solid-state imaging device 10 and has a predetermined width within which the pad formation region 15A is formed, and the bonding region 27 extends along the four sides of the substrate 20 and overlaps with at least part of the lead island formation region 25A. In the configuration shown in the present embodiment, the first leg portion 51 of the frame member 50 is formed in a symmetric manner in which the first leg portion 51 also extends along the side that has no pad 15 formed therealong (front side) and faces the side along which pads 15 are formed (back side).

The wire accommodation portion 55 is a concave space that is formed between the first leg portion 51 and the second leg portion 52 and has an arch-like shape or opens downward. As described above, the distance between the centers of the opposing lower end portions of the first leg portion 51 is substantially equal to the distance between the opposing sides of the pad formation region 15A, and the distance between the centers of the opposing lower end portions of the second leg portion 52 is slightly greater than the distance between the opposing sides of the lead island formation region 25A. When the thus configured frame member 50 is bonded and fixed to the sensor unit 1, the wire accommodation portion 55 forms a space that surrounds the side portions of the solid-state imaging device 10, and the portion of the space that extends along the sides of the solid-state imaging device 10 accommodates the bonding wires 30, 30, . . . .

In the thus configured solid-state imaging apparatus 100, the lens unit 2 includes the frame member 50, which has a frame-like shape that surrounds the side portions of the solid-state imaging device 10 and has the first leg portion 51, which is formed on the lower surface of the frame member 50 and covers the upper side of the pads 15, and the optical member 60, which is light transmissive and accommodated in the frame member 50. The first leg portion 51 of the frame member 50 extends from the side where the optical member 60 is present toward the imaging surface 11. The frame member 50 is integrally fixed to the solid-state imaging device 10 with the first leg portion 51 covering the first ends 31 of the bonding wires 30 that are connected to the pads 15. According to the configuration described above, light L traveling through the optical member 60 toward the first ends 31 of the bonding wires 30 is blocked by the first leg portion 51 as shown in FIG. 4A, whereby flare resulting from light reflected off the bonding wires 30 will not occur.

Further, in the solid-state imaging apparatus 100 of the present embodiment, the frame member 50 is fixed to the solid-state imaging device 10 by bonding the first leg portion 51 with the adhesive 56 to the portion where the bonding wires 30 are connected to the pads 15. According to the configuration described above, the frame member 50 can be fixed to and supported by the solid-state imaging device 10 without any need to form an extra region to which the first leg portion 51 is bonded on the imaging surface 11 of the solid-state imaging device 10, whereby the size of the apparatus can be reduced.

Moreover, in the solid-state imaging apparatus 100 of the present embodiment, the frame member 50 is fixed to the solid-state imaging device 10 by bonding the first leg portion 51 to the imaging surface 11 with the adhesive 56, which covers the pads 15 and the first ends 31 of the bonding wires 30. According to the configuration described above, the position of the frame member 50 with respect to the solid-state imaging device 10 can be directly defined, whereby the frame member 50 can be readily positioned with respect to the solid-state imaging device 10. Further, since the adhesive 56 covers and protects the first ends 31 of the bonding wires, reliability of the connection can be improved against vibration and other external influences. This also holds true for the second ends 32 of the bonding wires.

Further, the second leg portion 52 is bonded to the upper surface of the substrate 20 with the adhesive 57, which covers the second ends 32 of the bonding wires 30. The lens unit 2 is therefore bonded to the sensor unit 1 not only via the frame-shaped bonding region 16 for the first leg portion 51 but also via the frame-shaped bonding region 27 for the second leg portion 52, whereby the frame member 50 can be fixed more securely in the solid-state imaging apparatus 100. Moreover, the size of the second leg portion 52 can be reduced with certain fixing strength maintained, whereby the size of the frame member 50 and hence the size of the entire solid-state imaging apparatus 100 can be reduced. Further, since the adhesive 57 covers and protects the second ends 32 of the bonding wires, reliability of the connection can be improved against vibration and other external influences.

The solid-state imaging apparatus 100 is formed by covering the sensor unit 1 with the lens unit 2 from above and integrally fixing the frame member 50 to the solid-state imaging device 10 with the optical member 60 facing the imaging surface 11 of the solid-state imaging device 10 and the first ends 31 of the bonding wires 30 covered with the first leg portion 51.

In this process, when the adhesive 56 is applied to the bonding region 16 to cover the first ends 31 and the lens unit 2 is moved downward from above the sensor unit 1 to which the adhesive 56 has been applied, the adhesive 56 adheres to the lower end portions of the first leg portion 51 so that the first leg portion 51 is bonded to the pad 15 to which the bonding wires 30 have been connected. The frame member 50 is thus bonded and fixed to the imaging surface 11 of the solid-state imaging device 10 with the adhesive 56.

The frame member 50 has a protrusion 510 protruding from the first leg portion 51 toward the pads 15. Specifically, the protrusion 510, which protrudes from a flat, leg lower surface 515 toward the solid-state imaging device 10, is formed on the lower end of the first leg portion 51, as shown in FIG. 4B. Similarly, a protrusion 520 protruding toward the substrate 20 is formed on the lower end of the second leg portion 52, as shown in FIG. 4A.

[How to Mount Lens Unit 2]

A description will be made of how to mount the lens unit 2 on the sensor unit 1 in the present embodiment. The description will be primarily made of an advantageous effect of the protrusions 510 and 520 formed on the first leg portion 51 and the second leg portion 52 with reference to FIGS. 5A to 5C. FIGS. 5A to 5C show a manufacturing step of attaching the lens unit 2 to the sensor unit 1. FIGS. 5A to 5C only show a right end portion of the solid-state imaging device 10 in the sensor unit 1 and part of the first leg portion 51 in the lens unit 2, and the description will be primarily made of a manufacturing step of bonding the first leg portion 51.

Each of the protrusion 510 formed on the lower end of the first leg portion 51 and the protrusion 520 formed on the lower end of the second leg portion 52 has not only a single-step convex shape but also a rib-like shape extending in a longitudinal direction. The longitudinal direction used herein extends along the rectangular sides of the first leg portion 51 or the second leg portion 52 viewed from below. That is, the protrusions 510 and 520 are provided along substantially the entire sides of the first leg portion 51 and the second leg portion 52.

Before the lens unit 2 is attached to the sensor unit 1, the adhesive 56 is applied to the bonding region 16 of the solid-state imaging device 10 (see FIG. 5A). Although not shown, the adhesive 57 is also applied to the bonding region 27 of the substrate 20.

After the adhesive 56 is applied to the bonding region 16 of the solid-state imaging device 10, the lens unit 2 is so moved downward from above the sensor unit 1 that the frame member 50 covers the sensor unit 1 (see arrow A1), as shown in FIG. 5A. FIG. 5A shows a state in which the first leg portion 51 is positioned immediately above the adhesive 56, that is, immediately above the bonding region 16.

From the state shown in FIG. 5A, the lens unit 2 is further so moved downward that the protrusion 510 on the lower end of the first leg portion 51 enters the adhesive 56 and the leg lower end surface 515 presses the adhesive 56 (see arrow A2), as shown in FIG. 5B. In this process, the lens unit 2 is lowered until the position of the frame member 50 in the height direction from the solid-state imaging device 10 reaches a position lower by a predetermined dimension than a reference position in the height direction where the frame member 50 is bonded and fixed to the solid-state imaging device 10.

After the lens unit 2 is lowered to the position lower by the predetermined dimension than the reference position in the height direction where the lens unit 2 is fixed as described above, the lens unit 2 is so lifted that the position of the frame member 50 in the height direction from the solid-state imaging device 10 coincides with the reference position in the height direction (see arrow A3). In this state, the adhesive 56 is irradiated with ultraviolet light, heated, or otherwise allowed to cure.

In the present embodiment, the following two-stage curing steps are carried out by way of example in accordance with the nature of the adhesive 56: a temporary curing step of irradiating the adhesive 56 with ultraviolet light to allow it to cure to some extent, and a heat curing step of heating the adhesive 56 to allow it to permanently cure. It is noted that the adhesive 56 may alternatively be one that dries and cures at room temperature. Similarly, to bond the second leg portion 52 to the substrate 20 with the adhesive 57, the adhesive 57 is allowed to cure in the same manner as the adhesive 56, which bonds the first leg portion 51 to the solid-state imaging device 10. By carrying out the manufacturing steps described above, the lens unit 2 is bonded and fixed to the sensor unit 1 at a predetermined position in the height direction. The lens unit 2 is thus mounted on the sensor unit 1.

As described above, the method for manufacturing the solid-state imaging apparatus 100 of the present embodiment includes the step of moving the frame member 50 downward from above the sensor unit 1 to which the adhesive 56 has been applied so that the frame member 50 covers the sensor unit 1 and the protrusion 510 enters the adhesive 56 to a point where the root of the protrusion 510 comes into contact with the adhesive 56 and the step of lifting the frame member 50 to a predetermined position in the height direction to allow the adhesive 56 to solidify (cure). According to the method for manufacturing the solid-state imaging apparatus 100 described above, the protrusion 510 formed on the first leg portion 51 and the protrusion 520 formed on the second leg portion 52 allow the bonding area to increase as compared with a case where no protrusion is provided, whereby the bonding strength between the sensor unit 1 and the frame member 50 can be improved, and hence the frame member 50 can be fixed more securely in the solid-state imaging apparatus 100. Further, the sizes of the first and second leg portions can be reduced with certain bonding strength maintained, whereby the size of the entire solid-state imaging apparatus 100 can be reduced.

Moreover, by temporarily lowering the frame member 50 to a position lower by a predetermined dimension than the reference position in the height direction (FIG. 5B), and then lifting the frame member 50 to the reference position in the height direction (FIG. 5C), a fillet 56a of the adhesive 56 can be formed around the leg lower surface 515 of the first leg portion 51 (FIG. 5C, see portions surrounded by broken lines). The bonding area and hence the bonding strength can be further increased.

In the present embodiment, in which the convex protrusions 510 and 520 protruding downward are presented as a protrusion by way of example of protrusions, a concave or saw-toothed recess that opens downward can also be used. The alternative configuration also allows the bonding area and hence the bonding strength to be increased.

[Second Embodiment]

The structure of leg portions in a second embodiment will next be described. The portions common to those in the embodiment described above have the same reference characters, and no description thereof is made as appropriate. The present embodiment differs from the embodiment described above in that a protrusion formed on the lower end of the first leg portion 51 has a two-step convex shape having different protruding heights.

Figure 6:
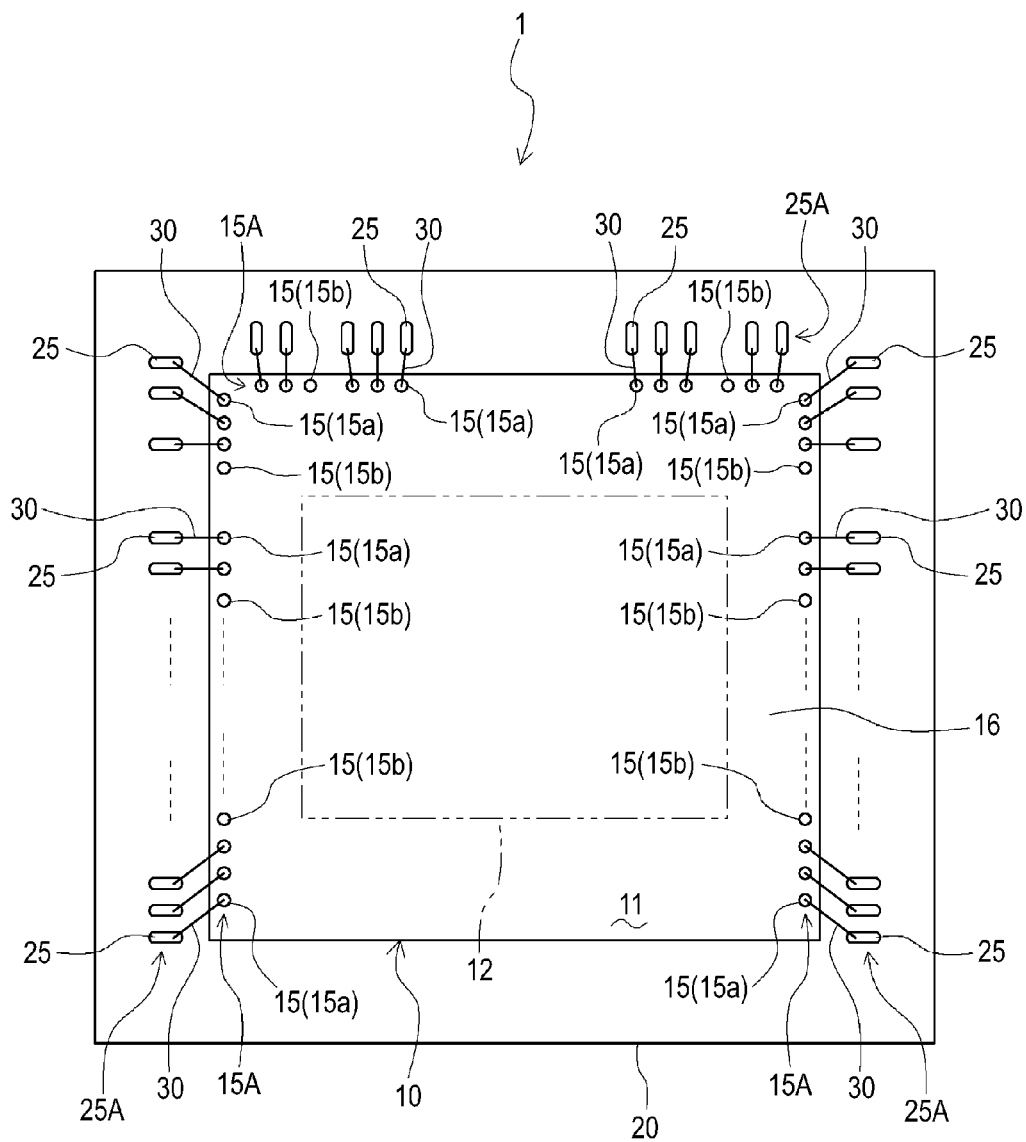
FIG. 6 is a diagrammatic plan view of a sensor unit in another solid-state imaging apparatus to which the present technology is applied.

The structure of the leg portions in the present embodiment is preferably employed when some of the pads 15 on the solid-state imaging device 10 are what is called open pads 15b. In the present embodiment, the pads 15 are therefore classified into connected pads 15a, to which the bonding wires 30 are connected, and open pads 15b, which are non-connected pads to which no bonding wires 30 are connected. That is, in the present embodiment, a plurality of pads 15 formed on the imaging surface 11 of the solid-state imaging device 10 are classified into the connected pads 15a, to which the bonding wires 30 are connected and through which signals are inputted and outputted, and the open pads 15b, which are non-connected pads to which no bonding wires 30 are connected, as shown in FIG. 6.

Figure 7:
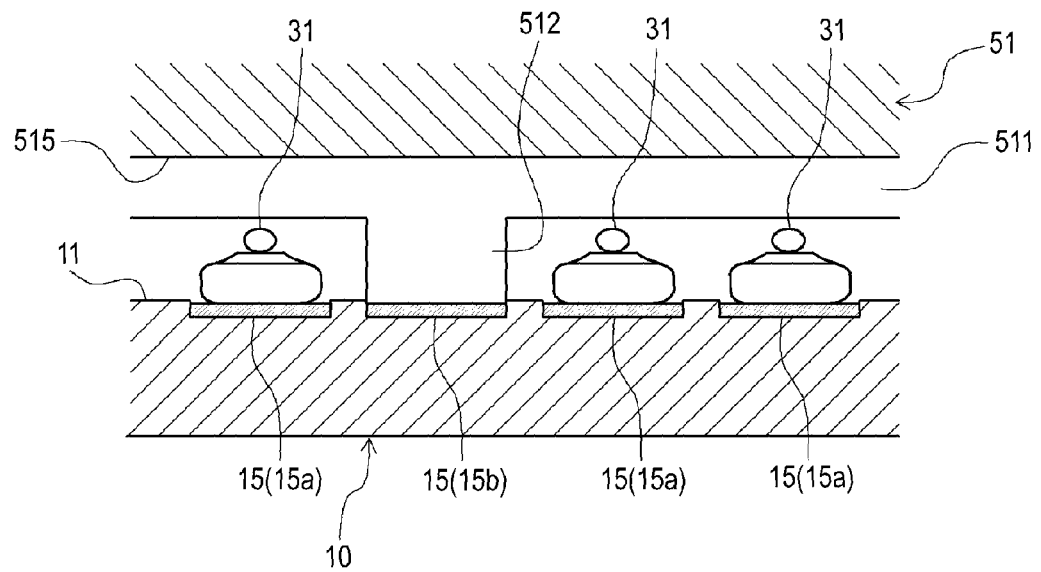
FIG. 7 is a descriptive diagram for describing the relationship between pads and protrusions in the solid-state imaging apparatus to which the present technology is applied.
Figure 8:
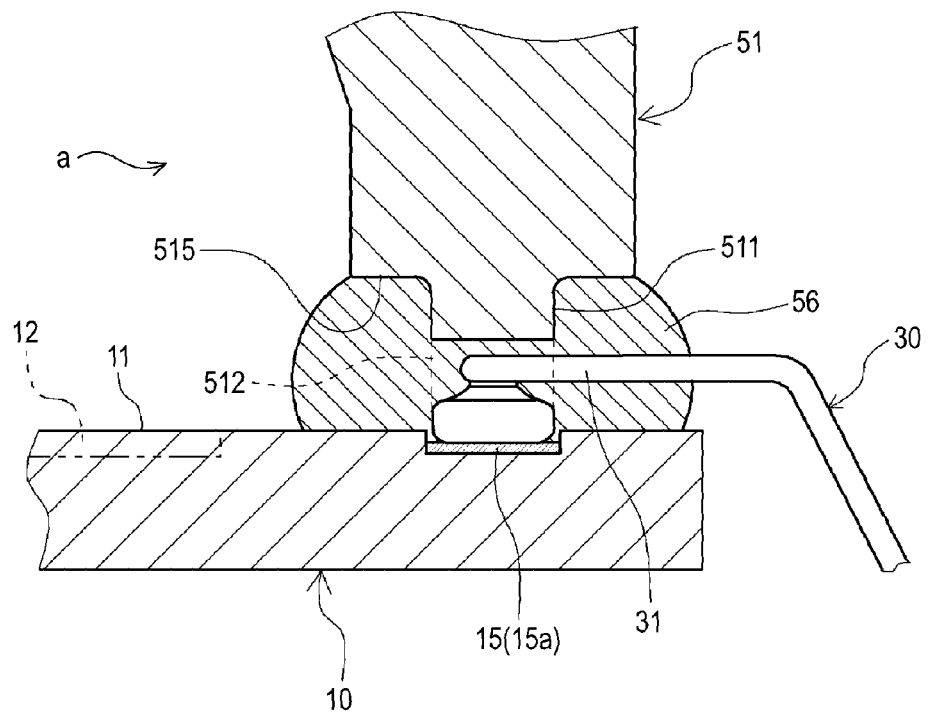
FIG. 8 is another descriptive diagram for describing the relationship between the pads and protrusions in the solid-state imaging apparatus to which the present technology is applied.
Figure 9:
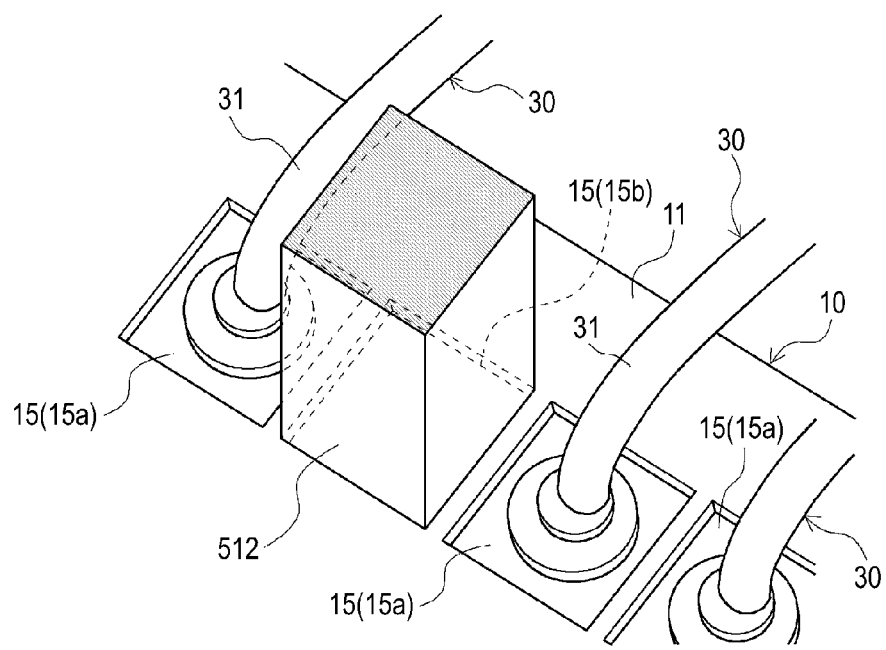
FIG. 9 is another descriptive diagram for describing the relationship between the pads and protrusions in the solid-state imaging apparatus to which the present technology is applied.

FIGS. 7 to 9 are descriptive diagrams for describing the relationship between the pads 15 and the protrusion. FIG. 7 is a partial enlarged view showing a portion where the first leg portion 51 is bonded to the pads 15 shown in the second embodiment. FIG. 8 is a side view of the bonded portion shown in FIG. 7 viewed in the direction indicated by the arrow "a". FIG. 9 is a descriptive diagram for describing a state in which a second protrusion 512, which will be described below, is disposed.

The protrusion formed on the first leg portion 511 is formed of a first protrusion 511 and a second protrusion 512 and has a two-step convex shape. The first protrusion 511 is a rib-shaped protrusion convexly protruding from the leg lower surface 515 and extending in a longitudinal direction. The longitudinal direction used herein extends along the rectangular sides of the first leg portion 51 viewed from below. That is, the first protrusion 511 is provided along substantially the entire sides of the first leg portion 51. The second protrusion 512 is a rectangular-columnar or cylindrical protrusion further protruding downward from the first protrusion 511 in correspondence with the arrangement of the open pads 15b. As described above, in the present embodiment, the second protrusion 512 of the frame member 50 works as a positioning protrusion protruding from the first leg portion 51 toward each open pad 15b.

The frame member 50 is fixed with the adhesive 56 with the second protrusion 512 being in contact with and supported by the corresponding open pad 15b. That is, the frame member 50 is integrally fixed to the solid-state imaging device 10 with the second protrusion 512 being in contact with the corresponding open pad 15b and the first ends 31 of the bonding wires 30 covered with the first leg portion 51. As a result, below the first leg portion 51 is present a gap located between the imaging surface 11 of the solid-state imaging device 10 and the first protrusion 511 and having a size corresponding to the protruding dimension of the second protrusion 512. The space between the imaging surface 11 and the first protrusion 511 is filled with the adhesive 56. When a plurality of second protrusions 512 are present along each of the sides of the first leg portion 51, a space to be filled with the adhesive 56 is formed between adjacent two second protrusions 512, 512.

The protruding height of the second protrusion 512 is so set that when the lower end surface of the second protrusion 512 comes into contact with and is supported by the corresponding open pad 15b, the position of the frame member 50 in the height direction from the solid-state imaging device 10 (position in Z-axis direction) coincides with the reference position in the height direction described above. The height of the protrusion 520 formed on the second leg portion 52 is so set that the lower end of the second leg portion 52 does not directly come into contact with the substrate 20 with the lower end surface of the second protrusion 512 being in contact with and supported by the corresponding open pad 15b but the adhesive 57 having a predetermined thickness is interposed between the lower end of the second leg portion 52 and the substrate 20. In other words, the frame member 50 is directly supported by the imaging surface 11 of the solid-state imaging device 10 via the second protrusion 512 of the first leg portion 51, whereby the position of the frame member 50 in the height direction or the vertical direction (Z-axis direction) with respect to the solid-state imaging device 10 is defined. The second protrusion 512 is provided along at least two sides of the pad formation region 15A in at least three positions in total. In correspondence with the second protrusions 512, the pads 15 on the solid-state imaging device 10 include at least three open pads 15b. That is, in the solid-state imaging apparatus 100 of the present embodiment, the number of pairs of open pad 15b and corresponding second protrusion 512 is at least three.

Figure 10A:
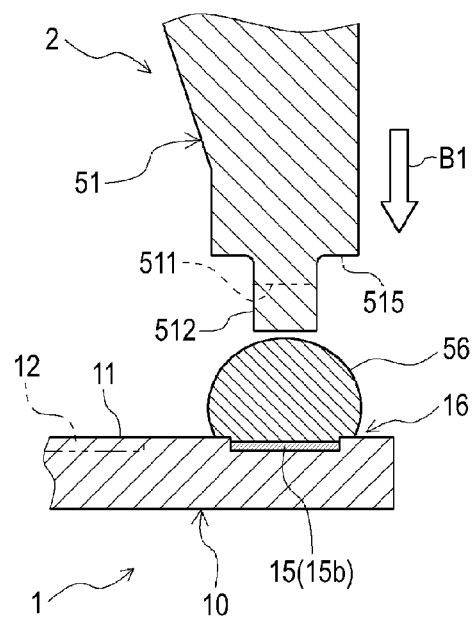
FIGS. 10A and 10B are descriptive diagrams for describing a method for manufacturing the solid-state imaging apparatus to which the present technology is applied.
Figure 10B:
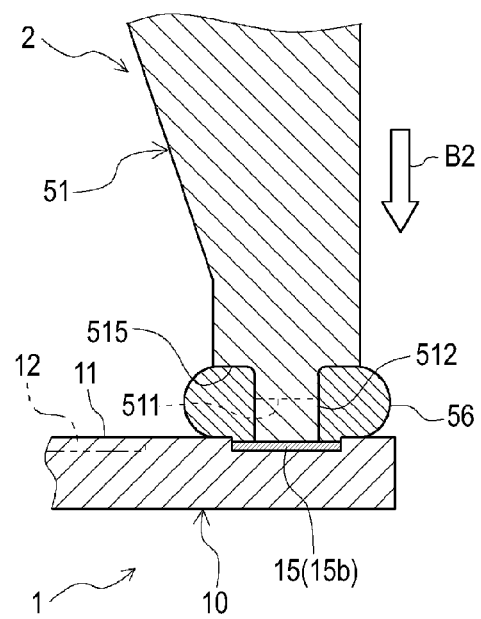

A method for manufacturing the solid-state imaging apparatus 100 having the leg structure described above will be described with reference to FIGS. 10A and 10B. FIGS. 10A and 10B show a manufacturing step of attaching the lens unit 2 to the sensor unit 1. FIGS. 10A and 10B only show a right end portion of the solid-state imaging device 10 in the sensor unit 1 and part of the first leg portion 51 in the lens unit 2, and the description will be primarily made of a manufacturing step of bonding the first leg portion 51.

Before the lens unit 2 is attached to the sensor unit 1, the adhesive 56 is applied to the bonding region 16 of the solid-state imaging device 10 (see FIG. 10A). Although not shown, the adhesive 57 is also applied to the bonding region 27 of the substrate 20.

After the adhesive 56 is applied to the bonding region 16 of the solid-state imaging device 10, the lens unit 2 is so moved downward from above the sensor unit 1 that the frame member 50 covers the sensor unit 1 (see arrow B1), as shown in FIG. 10A. FIG. 10A shows a state in which the first leg portion 51 is positioned immediately above the adhesive 56, that is, immediately above the bonding region 16.

From the state shown in FIG. 10A, the lens unit 2 is further so moved downward that the first protrusions 511 and the second protrusions 512 of the first leg portion 51 enter the adhesive 56 and the second protrusions 512 come into contact with the open pads 15b (see arrow B2), as shown in FIG. 10B. At this point, the position of the frame member 50 in the height direction from the solid-state imaging device 10 coincides with the reference position in the height direction where the frame member 50 is bonded and fixed to the solid-state imaging device 10.

With the second protrusions 512 being in contact with and supported by the open pads 15b, the adhesive 56 with which the gaps between the leg lower surface 515 and the imaging surface 11 of the solid-state imaging device 10 are filled is irradiated with ultraviolet light, heated, or otherwise allowed to cure. The lens unit 2 is thus bonded and fixed to the sensor unit 1 at a predetermined position in the height direction, and the lens unit 2 is thus mounted on the sensor unit 1.

According to the method for manufacturing the solid-state imaging apparatus 100 described above, the bonding area can be further increased as compared with the case where the leg structure in the embodiment described above is employed. As a result, the bonding strength between the sensor unit 1 and the frame member 50 can be improved, and hence the frame member 50 can be fixed more securely in the solid-state imaging apparatus 100. Further, the sizes of the first and second leg portions can be reduced with certain bonding strength maintained, whereby the size of the entire solid-state imaging apparatus 100 can be reduced.

Further, in the solid-state imaging apparatus 100 of the present embodiment, the frame member 50 is so moved downward from above the sensor unit 1 that the frame member 50 covers the sensor unit 1, and the frame member 50 is integrally fixed to the solid-state imaging device 10 with the adhesive 56 with the second protrusions 512 being in contact with the open pads 15b on the solid-state imaging device 10. According to the configuration described above, when the frame member 50 is fixed to the solid-state imaging device 10, the frame member 50 is automatically positioned in the Z-axis direction with respect to the imaging surface 11 of the solid-state imaging device 10. That is, when the frame member 50 is fixed to the solid-state imaging device 10, the lenses 61 in the lens unit 2 are reliably disposed in parallel to the solid-state imaging device 10 in the sensor unit 1, whereby complex adjustment is not necessary is a assembling step of the solid-state imaging apparatus 100 or the adjustment in the assembling step can be simplified and readily made.

According to the configuration described above, in which the second protrusions 512 are provided along at least two sides of the pad formation region 15A in at least three positions in total, positioning of the frame member 50 with respect to the solid-state imaging device 10 can be simplified from six-axis adjustment to three-axis adjustment.

Specifically, in the solid-state imaging apparatus 100 of the present embodiment, positioning may be performed only on parameters associated with three axes in total, that is, the positions of the frame member 50 in the X-axis and Y-axis directions and the angle of rotation θ of the frame member 50 around the Z axis with respect to the solid-state imaging device 10 (see FIG. 1). The adhesives 56 and 57 are then allowed to cure so that the frame member 50 is fixed with the position of the frame member 50 with respect to the solid-state imaging device 10 adjusted through the three-axis adjustment. The reason why the frame member 50 can be positioned by performing the three-axis adjustment is that the configuration in which the second protrusions 512 of the first leg portion 51 of the frame member 50 are directly supported by the open pads 15b allows the position of the frame member 50 in the Z-axis direction and tilts thereof around the X-axis and Y-axis directions to be defined as long as the precision in dimension of the frame member 50 falls within a predetermined range.

That is, according to the solid-state imaging apparatus 100 of the present embodiment, adjustment associated with the three axes, the height from the imaging surface 11 of the solid-state imaging device 10 (Z direction) and the tilts around the X-axis and Y-axis directions with respect to the imaging surface 11, is not necessary or six-axis adjustment performed in related art can be simplified to the three-axis adjustment, that is, adjustment with respect to the horizontal and vertical directions (X and Y) and the rotational direction (θ) of the solid-state imaging device 10, whereby the number of manufacturing steps of assembling the solid-state imaging apparatus 100 and the position adjustment step can be simplified. As described above, according to the solid-state imaging apparatus 100 of the present embodiment, the correction and focus adjustment performed when the apparatus is assembled can be simplified and readily performed, whereby working time can be shortened and the cost of the apparatus can be reduced accordingly.

Further, according to the solid-state imaging apparatus 100 of the present embodiment, since the optical member 60 is positioned with respect to the solid-state imaging device 10 by using the frame member 50, position adjustment performed when the lens unit 2 is attached to the sensor unit 1 can be performed with respect to the upper surface of the optical member 60, whereby work time can be shortened and the lens unit 2 can be assembled with high precision.

[How to Connect Bonding Wires]

Figure 11A:
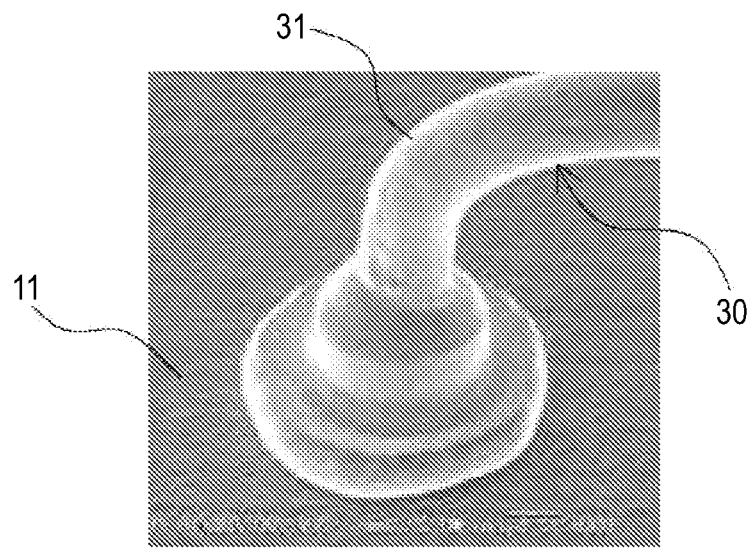
FIGS. 11A and 11B are photomicrographs of a bonding wire in a solid-state imaging apparatus to which the present technology is applied.
Figure 11B:
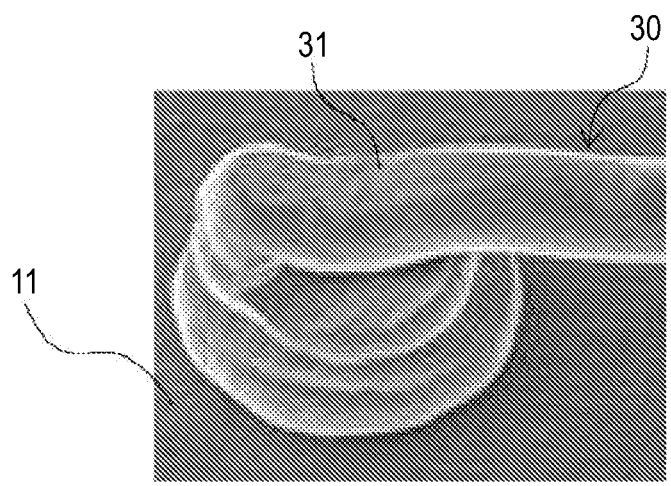

How to connect the bonding wires 30 to the pads 15 will next be described. FIGS. 11A and 11B are photomicrographs of a portion in the vicinity of the first end 31 of one of the bonding wires 30 connected to the pads 15. FIG. 11A is a photomicrograph of the first end 31 connected by using a typical looping method (typical loop), and FIG. 11B is a photomicrograph of the first end 31 connected by using a looping method that allows the loop height to be lower than that in the typical looping method (low loop).

Figure 12A:
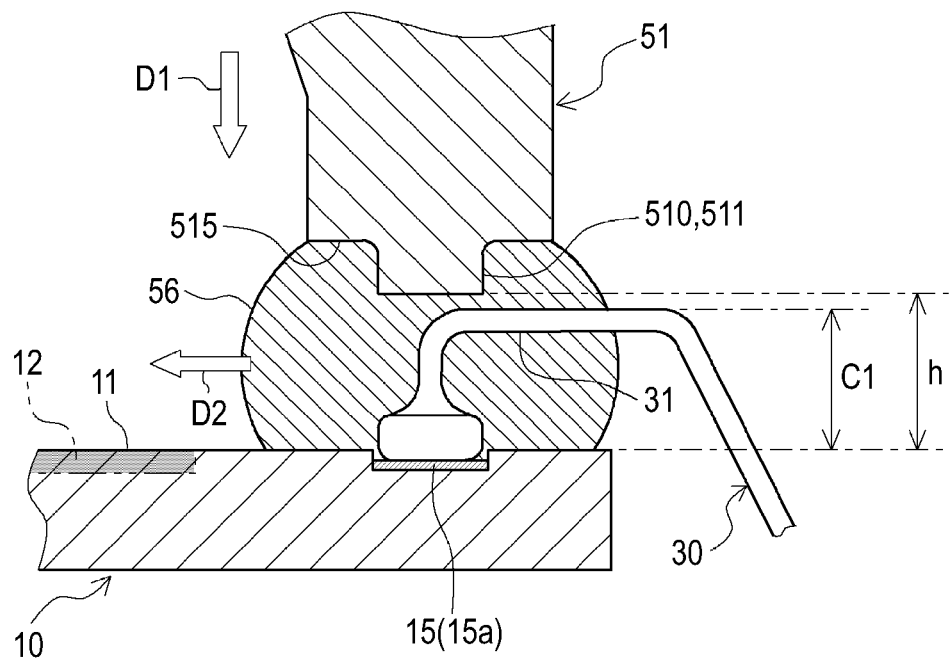
FIGS. 12A and 12B show comparison of the shape of the bonding wire in solid-state imaging apparatus to which the present technology is applied.
Figure 12B:
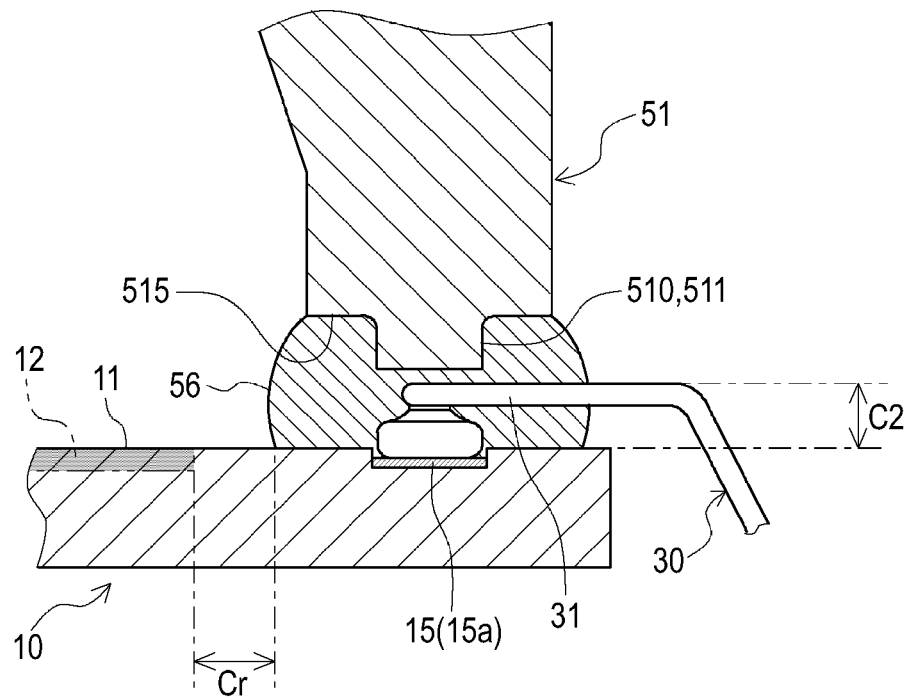

The loop height is the height (dimension in Z-axis direction) C1 or C2 of the first end 31 of any of the bonding wires 30 with respect to the imaging surface 11 of the solid-state imaging device 10, as shown in FIGS. 12A and 12B. The loop height C2 in the low loop structure can be about half the loop height C1 in the typical loop structure. A connection method based on the low loop structure shown in FIGS. 11B and 12B is a known technique, and see JP-A-2007-012642 and other documents for details about the connection method.

In the embodiment described above, the bonding wires 30 can be connected to the pads 15 by using either the typical loop connection method or the low-loop connection method. Using the low-loop connection method, however, provides the following advantageous effects as compared with a case where the typical loop connection method is used.

First, employing the low-loop structure shown in FIG. 12B allows the gap between the imaging surface 11 of the solid-state imaging device 10 and the leg lower surface 515 of the first leg portion to be smaller than the gap created in a case where the typical-loop structure shown in FIG. 12A is employed. According to the low-loop structure shown in FIG. 12B, the first leg portion 51 itself can therefore prevent light from reaching the first ends 31 in a more satisfactory manner, whereby flare can be more effectively suppressed.

Further, employing the low-loop structure shown in FIG. 12B is preferable in that when the lens unit 2 is mounted on the sensor unit 1, the lower end of the first leg portion 51, that is, the tip of the protrusion 510 or the first protrusion 511 less likely comes into contact with the bonding wires 30.

That is, in the typical-loop structure shown in FIG. 12A, in which the loop height is higher than that in the low-loop structure shown in FIG. 12B, the first leg portion 51 quite likely comes into contact with the bonding wires 30 when the lens unit 2 is mounted on the sensor unit 1. When the first leg portion 51 comes into contact with the bonding wires 30, the bonding wires 30 can be deformed or broken, possibly resulting in poor connection or other failures. In contrast, employing the low-loop structure reduces the risk resulting from contact between the first leg portion 51 and the bonding wires 30 at the time of mounting the lens unit 2, as shown in FIG. 12B.

Further, in the manufacturing step of bonding the first leg portion 51 to the solid-state imaging device 10, employing the low-loop structure shown in FIG. 12B can reduce the amount of adhesive 56 on the imaging surface 11 that spreads toward the imaging region 12.

Specifically, in the manufacturing step of bonding the first leg portion 51 to the solid-state imaging device 10, when the lens unit 2 is lowered to press the adhesive 56 (see arrow D1), the adhesive 56 flows rightward and leftward into the imaging region 12 in accordance with the viscosity and surface tension of the adhesive 56 (see arrow D2), as shown in FIG. 12A. When the adhesive 56 flows as described above, the adhesive 56 possibly enters the imaging region 12. The possibility of the adhesive 56 entering the imaging region 12 increases as the distance between the bonding region 16, where the pads 15 are disposed, and the imaging region 12 is shortened in association with size reduction of the solid-state imaging device 10 and increase in the number of pixels thereof. Further, the higher the loop height of the bonding wires 30 is, the more the amount of adhesive 56 necessary to cover all the bonding wires 30 at the time of the assembly of the lens unit 2. The possibility of the adhesive 56 entering the imaging region 12 therefore also increases when the loop height of the bonding wires 30 increases.

The typical-loop structure shown in FIG. 12A, in which the loop height is relatively high, is therefore disadvantageous as compared with the low-loop structure shown in FIG. 12B from the viewpoint of preventing the adhesive 56 from entering the imaging region 12 resulting from the free-flow characteristic of the adhesive 56 described above. That is, since employing the low-loop structure shown in FIG. 12B reduces the amount of adhesive 56 necessary to mount the lens unit 2, a sufficient clearance Cr between the adhesive 56 and the imaging region 12 on the imaging surface 11 of the solid-state imaging device 10 can be readily ensured, whereby it is not only readily possible to reduce the size of the solid-state imaging device 10 but also prevent the adhesive 56 from entering the imaging region 12.

Figure 13:
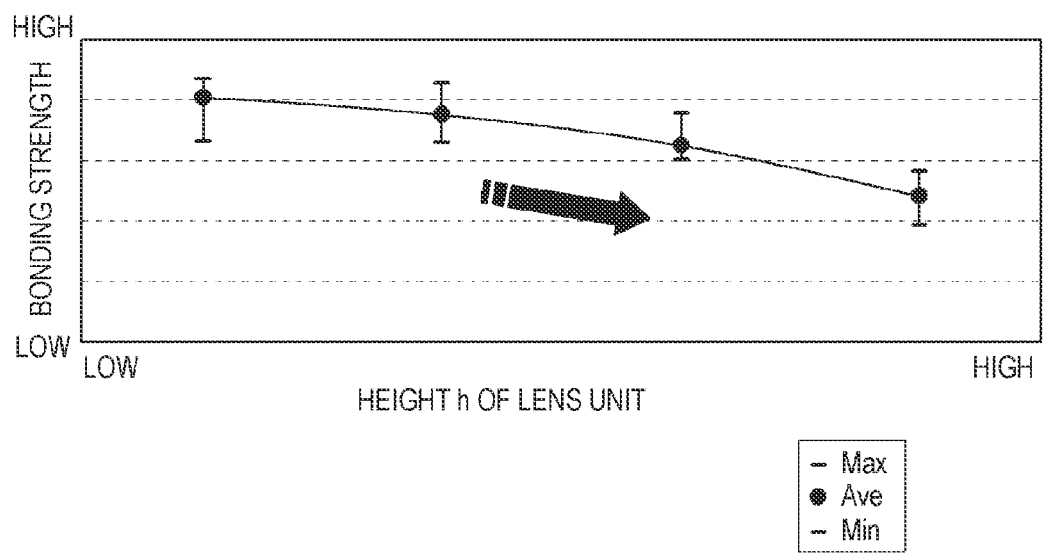
FIG. 13 shows an example of the relationship between the height of a lens unit and bonding strength in a solid-state imaging apparatus to which the present technology is applied.

Further, employing the low-loop structure shown in FIG. 12B improves the bonding strength between the first leg portion 51 and the solid-state imaging device 10. FIG. 13 shows experimental data illustrating change in the bonding strength between the first leg portion 51 and the solid-state imaging device 10 versus change in height h of the lens unit. In FIG. 13, the horizontal axis represents the height h of the lens unit, and the vertical axis represents the bonding strength. The height h of the lens unit is the distance from the imaging surface 11 of the solid-state imaging device 10 to the lower end surface of the first leg portion 51, as shown in FIG. 12A.

As seen from the experimental data shown in FIG. 13, the bonding strength between the first leg portion 51 and the solid-state imaging device 10 decreases as the height h of the lens unit increases. The behavior of the bonding strength versus the height of the lens unit results from the fact that when the loop height of the bonding wires 30 increases, the height h of the lens unit increases, and that when the loop height of the bonding wires 30 increases, the amount of adhesive 56 necessary to mount the lens unit 2 increases as described above. The experimental data shown in FIG. 13 shows that the height h of the lens unit closely relates to the bonding strength achieved by the adhesive 56. As described above, employing the low-loop structure shown in FIG. 12B can reduce the height h of the lens unit and hence improve the bonding strength between the first leg portion 51 and the solid-state imaging device 10.

[Adhesive]

In the thus configured solid-state imaging apparatus 100, the adhesive 56, which bonds the first leg portion 51 of the frame member 50 to the solid-state imaging device 10 preferably, has at least a light-blocking or light-absorbing portion that covers the first ends 31 of the bonding wires 30. When the adhesive 56 with which the first leg portion 51 is bonded and fixed to the solid-state imaging device 10 has a certain degree of light-blocking or light-absorbing capability, light traveling toward the first ends 31 of the bonding wires 30 at a shallow angle with respect to the imaging surface 11 may not be reflected off the first ends 31 or flare will not occur, because the adhesive 56 prevents the light from reaching the first ends 31.

Examples of the adhesive 56 having a light-blocking or light-absorbing capability may include a resin-based adhesive made, for example, of an organic material based on epoxy, acryl, silicone, or thiol to which carbon black or any other suitable pigment is added as a reflectance reducing material so that the adhesive is colored blackish. A method for allowing the adhesive 56 to cure may be heat curing or ultraviolet curing, or even drying at room temperature.

Figure 14:
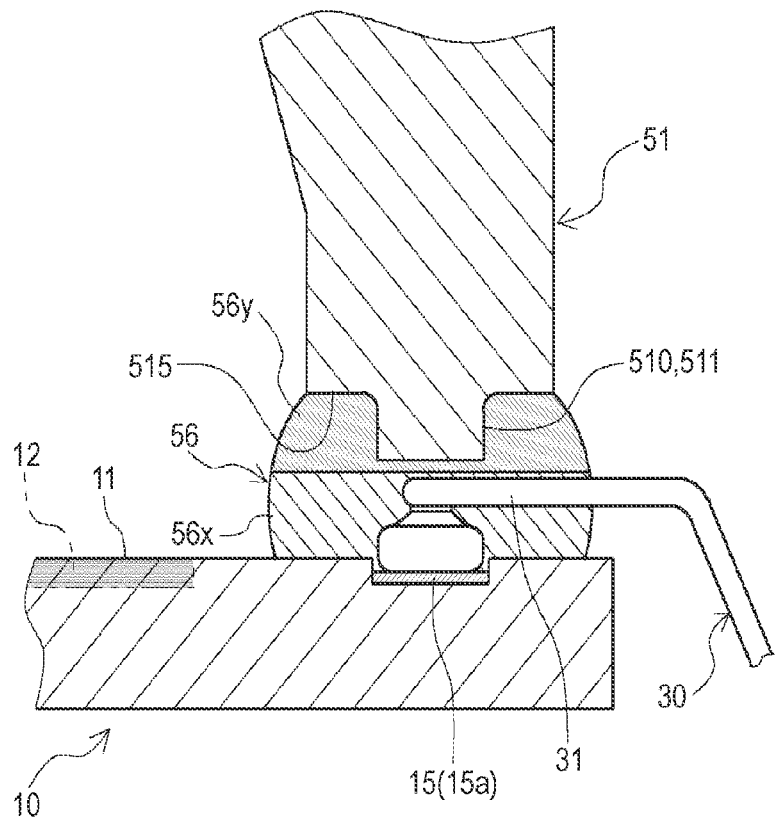
FIG. 14 is a descriptive diagram of a bonding structure in a solid-state imaging apparatus to which the present technology is applied.

The adhesive 56 applied to the bonding region 16 may alternatively have a multilayer configuration including two layers or three or more layers. In this case, an upper-layer adhesive located above the first ends 31 or an outer-layer adhesive of a plurality of layers including inner and outer layers may have a light-blocking capability. FIG. 14 shows a case where the adhesive 56 has a two-layer structure formed of a lower layer 56x on the lower side (the side where the solid-state imaging device 10 is present) and an upper layer 56y provided on the lower layer 56x.

When the two-layer structure shown in FIG. 14 is employed, the upper layer 56y, through which light to be incident on the first ends 31 of the bonding wires 30 likely passes, is made of a light-blocking or light-absorbing resin to which carbon black or any other suitable pigment described above is added. When part of the adhesive 56 is made of a light-blocking or light-absorbing resin in consideration of the path along which light is incident on the first ends 31 of the bonding wires 30, light that reaches the first ends 31 can be effectively blocked, whereby flare can be effectively suppressed.

The adhesives 56 and 57 used to fix the lens unit 2 to the sensor unit 1 in the solid-state imaging apparatus 100 are typically required to have the following physical properties: First, the bonding strength is high enough to reliably fix the lens unit 2 to the sensor unit 1. If the adhesives 56 and 57 do not provide sufficient bonding strength, it is difficult to mount the lens unit 2 on the sensor unit 1 in an assembling step, resulting in a customer complaint.

Another physical property that the adhesives 56 and 57 are typically required to have is generating no halogen-based outgas when the adhesives 56 and 57 cure, for example, in the heat curing step described above. If a halogen-based outgas, such as F, Cl, Br, or I, is generated when the adhesives 56 and 57 cure, the portions to which the bonding wires 30 are connected corrode, resulting in poor connection due, for example, to disconnection of the bonding wires 30 from the connected portions in some cases.

Another physical property that the adhesives 56 and 57 are typically required to have is small thermal expansion or contraction, for example, in the heat curing step described above. If the thermal contraction of the adhesives 56 and 57 is large, the position of the lens unit 2 mounted on the sensor unit 1 may change in the curing process of the adhesives 56 and 57. Any change in the position of the lens unit 2 may cause a gap between the lens unit 2 and the adhesives 56, 57 or a gap between the sensor unit 1 and the adhesives 56,57, resulting in decrease in bonding strength and decrease in positioning precision.

Another physical property that the adhesives 56 and 57 are typically required to have is viscosity that falls within a certain range. If the viscosity of the adhesives 56 and 57 is too low, the adhesives 56 and 57 spread over, and, for example, flow down along the side surfaces of the substrate 20, resulting in contamination of the apparatus. Further, if the viscosity of the adhesives 56 and 57 is too low, it may be difficult to allow the adhesives 56 and 57 to be thick enough to achieve a necessary height of the lens unit 2 with respect to the sensor unit 1. On the other hand, if the viscosity of the adhesives 56 and 57 is too high, it may be difficult to apply the adhesives 56 and 57 or unevenness of the applied adhesives 56 and 57 may occur.

Another physical property that the adhesives 56 and 57 are typically required to have is being curable in a short period. If it takes long for the adhesives 56 and 57 to cure, it may be difficult to ensure positioning precision of the lens unit 2 with respect to the sensor unit 1, for example, in the temporary curing step described above, or a necessary production period may be lengthened.

An adhesive that satisfies the physical properties described above may be one made of an epoxy-based, acryl-based, or any other organic material-based resin described above.

The above embodiments have been described with reference to the configuration in which the lens unit 2 is assembled by accommodating the optical member 60 in the frame member 50 and the thus assembled lens unit 2 is mounted on the sensor unit 1 so that they are bonded and fixed to each other. The manufacturing step of accommodating the optical member 60 can, however, be changed as appropriate in accordance with the configuration of the solid-state imaging apparatus 100. For example, the frame member 50 may first be mounted on the sensor unit 1 so that they are bonded and fixed to each other, and the optical member 60 may then be accommodated in the fixed frame member 50.

[Example of Configuration of Electronic System]

Figure 15:
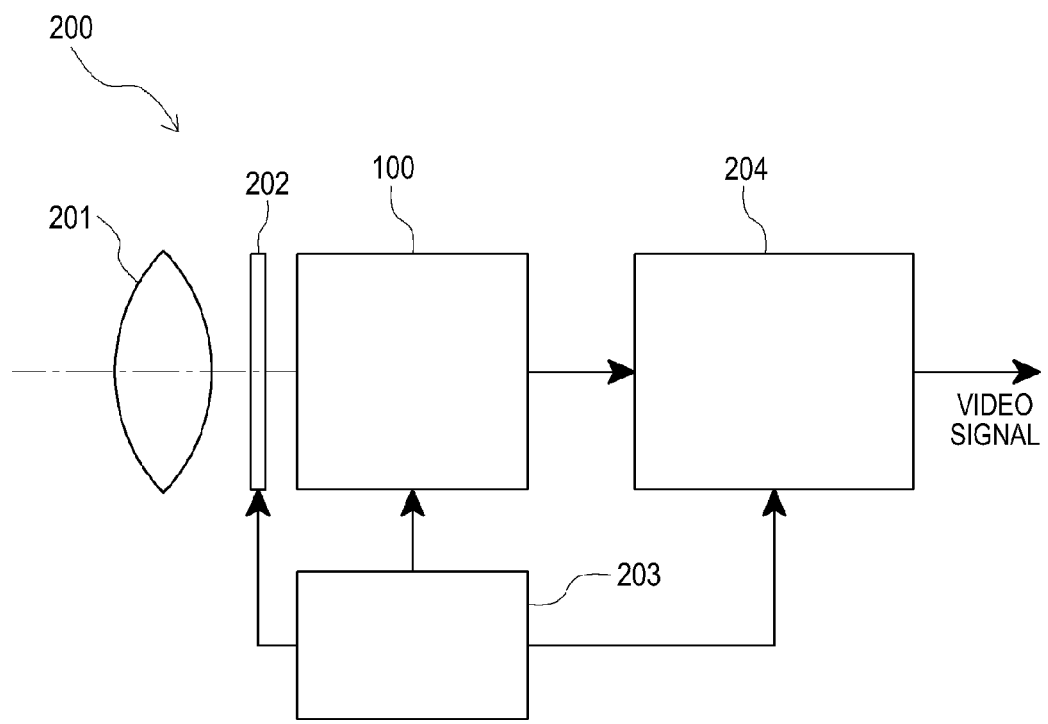
FIG. 15 is a block diagram illustrating the configuration of an electronic system to which the present technology is applied.
Figure 16:
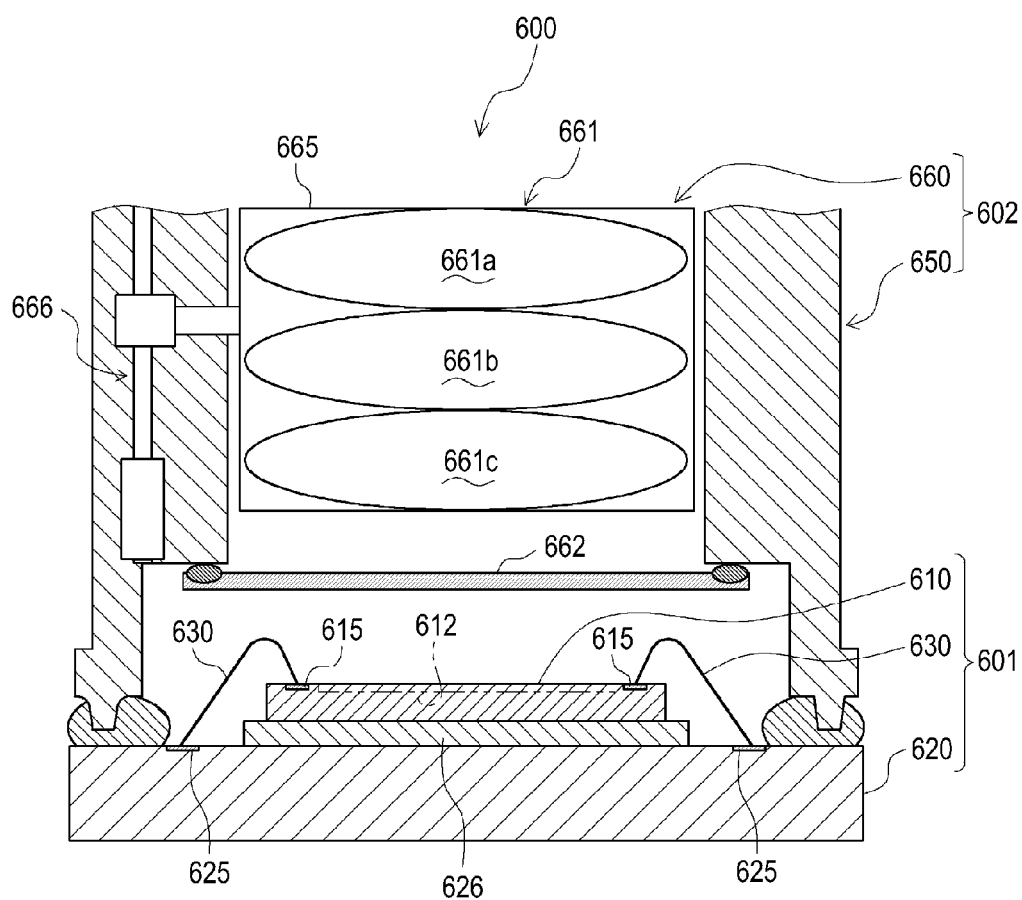
FIG. 16 is a diagrammatic cross-sectional view of a typical solid-state imaging apparatus of related art.
Figure 17:
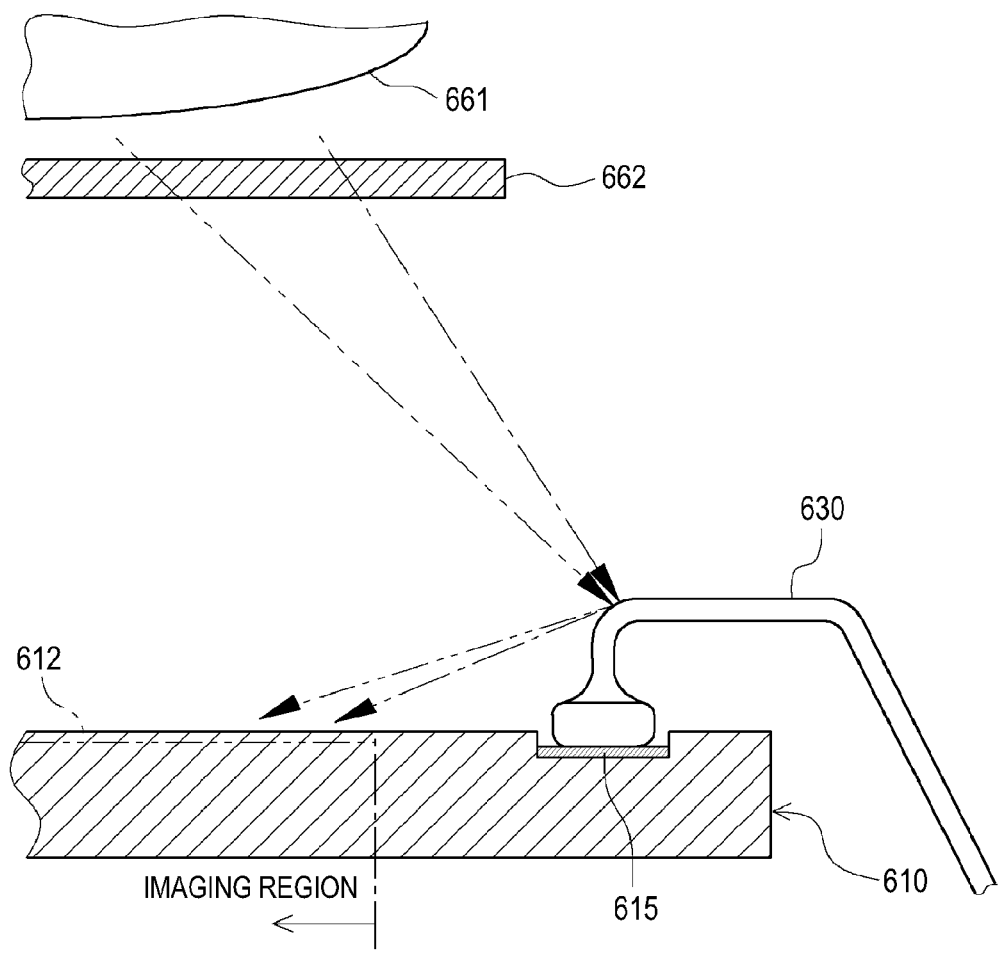
FIG. 17 a descriptive diagram for describing how flare occurs in a solid-state imaging apparatus of related art.
Figure 18:
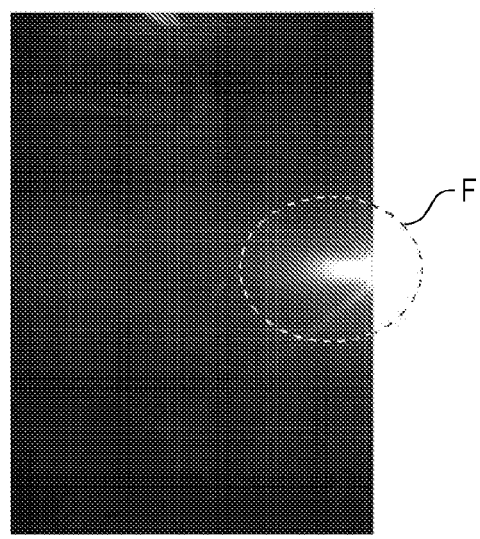
FIG. 18 is an image showing an example of flare produced in the solid-state imaging apparatus of related art.

The solid-state imaging apparatus 100 according to any of the embodiments described above can be used, for example, in a digital camera (digital still camera, digital video camcorder), a mobile phone having an imaging capability, and other imaging-related apparatus, and a variety of electronic systems. In the following sections, a video camcorder 200, which is an example of an electronic system including the solid-state imaging apparatus according to any of the embodiments described above, will be described with reference to FIG. 15. FIG. 15 is a block diagram showing the configuration of the video camcorder 200.

The video camcorder 200 captures a still image or video images. The video camcorder 200 includes the solid-state imaging apparatus 100 according to any of the embodiments described above, an optical system 201, a shutter apparatus 202, a system controller 203, and a signal processor 204.

The optical system 201 is configured, for example, to be an optical lens system including one or more optical lenses and guides incident light to a photodetection sensor unit in the solid-state imaging apparatus 100. The optical system 201 focuses image light from a subject (incident light) on the imaging surface 11 in the solid-state imaging apparatus 100. In this process, signal charge is accumulated for a certain period in the solid-state imaging apparatus 100. The solid-state imaging apparatus 100 converts the image light focused through the optical system 201 into an electric signal on a pixel basis and outputs the resultant image signal. The shutter apparatus 202 controls the period during which the solid-state imaging apparatus 100 is irradiated with the light and the period during which the light to the solid-state imaging apparatus 100 is blocked.

The system controller 203 outputs control signals to the solid-state imaging apparatus 100 and the signal processor 204 to control the operation of the entire video camcorder 200. The system controller 203 produces a drive signal for driving the solid-state imaging apparatus 100 at predetermined timing (timing signal) and supplies the drive signal to the solid-state imaging apparatus 100. The drive signal supplied from the system controller 203 to the solid-state imaging apparatus 100 controls, for example, transfer of the signal charge accumulated in the solid-state imaging apparatus 100. That is, the solid-state imaging apparatus 100 transfers the signal charge and performs other types of operation based on the drive signal supplied from the system controller 203.

The system controller 203 has a function of producing a variety of pulse signals as the drive signal for driving the solid-state imaging apparatus 100 and a function as a driver that converts the produced pulse signals into drive pulses for driving the solid-state imaging apparatus 100. The system controller 203 further produces and supplies a drive signal for controlling the operation of the shutter apparatus 202.

The signal processor 204, which has a function of performing a variety of types of signal processing, processes the signal outputted from the solid-state imaging apparatus 100 to produce a subject image. The signal processor 204 outputs a video signal by processing a signal inputted thereto. The video signal outputted from the signal processor 204 is stored in a memory or any other storage medium and outputted to a monitor. The video camcorder 200 further includes a battery or any other power supply that supplies electric power to the system controller 203 and other components, a storage unit that stores a video signal and other signals produced when images are captured, and a controller that controls the entire system.

According to the video camcorder 200 including the solid-state imaging apparatus 100 according to any of the embodiments described above, flare resulting from light reflected off the bonding wires 30 in the solid-state imaging apparatus 100 can be suppressed. A compact, high-quality, flare-suppressed electronic system can therefore be provided.

In the above description, the optical member 60 is formed of the lenses 61, the IRCF 62, and other components by way of example. The optical member 60 may alternatively be any other optical component that guides light to the solid-state imaging device 10, such as a flat cover glass plate. As a solid-state imaging apparatus including such a cover glass plate, a sensor package used in a digital camera and other imaging apparatus may be presented by way of example.

The present technology can also be configured as follows.

(1) A solid-state imaging apparatus including a solid-state imaging device mounted on a substrate, a bonding wire that electrically connects a pad formed on the solid-state imaging device to a lead island formed on the substrate, a frame member that has a frame-like shape and surrounds side portions of the solid-state imaging device, and a light-transmissive optical member so accommodated in the frame member that the optical member faces an imaging surface of the solid-state imaging device, wherein the frame member has a leg portion extending from the side where the optical member is present toward the imaging surface, and the frame member is integrally fixed to the solid-state imaging device with an end of the bonding wire that is connected to the pad covered with the leg portion.

(2) The solid-state imaging apparatus described in (1), wherein the frame member is so fixed to the solid-state imaging device that the leg portion is bonded with an adhesive to a portion where the bonding wire is connected to the pad.

(3) The solid-state imaging apparatus described in (1) or (2), wherein the frame member is so fixed to the solid-state imaging device that the leg portion is bonded to the imaging surface with an adhesive that covers the pad and an end of the bonding wire.

(4) The solid-state imaging apparatus described in (3), wherein at least a portion of the adhesive that covers the end of the bonding wire is light-blocking.

(5) The solid-state imaging apparatus described in (3) or (4), wherein the frame member has a protrusion protruding from the leg portion toward the pad.

(6) The solid-state imaging apparatus described in any of (1) to (4), wherein the pad is formed of a connected pad to which the bonding wire is connected and a non-connected pad to which the bonding wire is not connected, the frame member has a positioning protrusion protruding from the leg portion toward the non-connected pad, and the frame member is integrally fixed to the solid-state imaging device with the positioning protrusion being in contact with the non-connected pad and an end of the bonding wire covered with the leg portion.

(7) The solid-state imaging apparatus described in (6), wherein the non-connected pad is provided at least in three positions.

(8) The solid-state imaging apparatus described in any of (1) to (7), wherein the frame member has a second leg portion extending by the side portions of the solid-state imaging device toward the substrate, and the second leg portion is bonded to the substrate.

(9) The solid-state imaging apparatus described in any of (1) to (8), wherein the optical member includes a lens that guides incident light to the imaging surface.

(10) A method for manufacturing a solid-state imaging apparatus, the method including providing a sensor unit in which a solid-state imaging device is mounted on a substrate and a bonding wire electrically connects a lead island formed on the substrate to a pad formed on the solid-state imaging device, covering the sensor unit with an optical unit from above, the optical unit including a frame member and an optical member, the frame member having a frame-like shape that surrounds side portions of the solid-state imaging device and having a leg portion that is formed on a lower surface of the frame member and covers the pad from above, the optical member being light transmissive and accommodated in the frame member, and integrally fixing the frame member to the solid-state imaging device in such a way that the optical member faces an imaging surface of the solid-state imaging device and an end of the bonding wire that is connected to the pad is covered with the leg portion.

(11) A method for manufacturing a solid-state imaging apparatus, the method including providing a sensor unit in which a solid-state imaging device is mounted on a substrate and a bonding wire electrically connects a lead island formed on the substrate to a pad formed on the solid-state imaging device, covering the sensor unit with a frame member from above, the frame member having a frame-like shape that surrounds side portions of the solid-state imaging device and having a leg portion that is formed on a lower surface of the frame member and covers the pad from above, integrally fixing the frame member to the solid-state imaging device with an end of the bonding wire that is connected to the pad covered with the leg portion, and accommodating a light-transmissive optical member in the frame member in such a way that the optical member faces an imaging surface of the solid-state imaging device.

(12) The method for manufacturing a solid-state imaging apparatus described in (10) or (11), further including applying an adhesive in such a way that the end of the bonding wire that is connected to the pad is covered with the adhesive, moving the frame member downward from above the sensor unit, to which the adhesive has been applied, in such a way that the adhesive adheres to the leg portion so that the leg portion is boned to the pad to which the bonding wire has been connected, and allowing the frame member to be fixed to the solid-state imaging device with the adhesive.

(13) The method for manufacturing a solid-state imaging apparatus described in (12), wherein the frame member has a protrusion protruding from the leg portion toward the pad, the frame member is moved downward from above the sensor unit, to which the adhesive has been applied, in such a way that the frame member covers the sensor unit and the protrusion enters the adhesive to a point where a root of the protrusion comes into contact with the adhesive, and the frame member is then moved upward to a predetermined height position so that the adhesive is allowed to cure.

(14) The method for manufacturing a solid-state imaging apparatus described in any of (10) to (12), wherein the pad is formed of a connected pad to which the bonding wire is connected and a non-connected pad to which the bonding wire is not connected, the frame member has a positioning protrusion protruding from the leg portion toward the non-connected pad, a pair of the non-connected pad and the positioning protrusion corresponding thereto is provided at least in three positions, and the frame member is so moved downward from above the sensor unit that the frame member covers the sensor unit and the frame member is integrally fixed to the solid-state imaging device with at least three pairs of the positioning protrusion and the non-connected pad being in contact with each other.

(15) An electronic system including a solid-state imaging apparatus, and a signal processing circuit that processes a signal outputted from the solid-state imaging apparatus, the solid-state imaging apparatus including a solid-state imaging device mounted on a substrate, a bonding wire that electrically connects a pad formed on the solid-state imaging device to a lead island formed on the substrate, a frame member that has a frame-like shape and surrounds side portions of the solid-state imaging device, and a light-transmissive optical member so accommodated in the frame member that the optical member faces an imaging surface of the solid-state imaging device, wherein the frame member has a leg portion that covers the pad from above, and the frame member is integrally fixed to the solid-state imaging device with an end of the bonding wire that is connected to the pad covered with the leg portion.

It should be understood by those skilled in the art that various modifications, combinations, sub-combinations and alterations may occur depending on design requirements and other factors insofar as they are within the scope of the appended claims or the equivalents thereof.

What is claimed is:

1. A method for manufacturing an imaging apparatus, the method comprising:
   providing a sensor unit in which a solid-state imaging device is mounted on a substrate and a bonding wire electrically connects a lead island formed on the substrate to a pad formed on the solid-state imaging device;
   covering the sensor unit with an optical unit from above, the optical unit including a frame member and an optical member, the frame member having a frame-like shape that surrounds side portions of the solid-state imaging device and having a leg portion that is formed on a lower surface of the frame member and covers the pad from above, the optical member being light transmissive and accommodated in the frame member;
   integrally fixing the frame member to the solid-state imaging device in such a way that the optical member faces an imaging surface of the solid-state imaging device and an end of the bonding wire that is connected to the pad is covered with the leg portion;
   applying an adhesive in such a way that the end of the bonding wire that is connected to the pad is covered with the adhesive;
   moving the frame member downward from the above sensor unit, to the which the adhesive has been applied, in such a way that the adhesive adheres to the leg portion so that the leg portion is bonded to the pad to which the bonding wire has been connected; and
   allowing the frame member to be fixed to the solid-state imagining device with the adhesive,
   wherein
      the frame member has a protrusion protruding from the leg portion toward the pad,
      the frame member is moved downward from above the sensor unit, to which the adhesive has been applied, in such a way that the frame member covers the sensor unit and the protrusion enters the adhesive to a point where a root of the protrusion comes into contact with the adhesive, and
      the frame member is then moved upward to a predetermined height position so that the adhesive is allowed to cure.

2. A method for manufacturing an imaging apparatus, the method comprising:
   providing a sensor unit in which a solid-state imagining device is mounted on a substrate and a bonding wire electrically connects a lead island formed on the substrate to a pad formed on a solid-state imagining device;
   covering the sensor unit with an optical unit from above, the optical unit including a frame member and an optical member, the frame member having a frame-like shape that surrounds side portions of the solid-state imagining device and having a leg portion that is formed on a lower surface of the frame member and covers the pad from above, the optical member being light transmissive and accommodated in the frame member;
   integrally fixing the frame member to the solid-state imagining device in such a way that the optical member faces an imaging surface of the solid-state imaging device and an end of the bonding wire that is connected to the pad is covered with the leg portion,
   wherein
      the pad is formed of a connected pad to which to where the bonding wire is connected and a non-connected pad to which the bonding wire is not connected,
      the frame member has a positioning protrusion protruding from the leg portion toward the non-connected pad,
      a pair of the non-connected pad and the positioning protrusion corresponding thereto is provided at least in three positions, and
      the frame member is so moved downward from above the sensor unit that the frame member covers the sensor unit and the frame member is integrally fixed to the solid-state imaging device with at least three pairs of the positioning protrusion and the non-connected pad being in contact with each other.

3. A method for manufacturing an imaging apparatus, the method comprising:
   providing a sensor unit in which a solid-state imaging device is mounted on a substrate and a bonding wire electrically connects a lead island formed on the substrate to a pad formed on the solid-state imaging device;
   covering the sensor unit with a frame member from above, the frame member having a frame-like shape that surrounds side portions of the solid-state imaging device and having a leg portion that is formed on a lower surface of the frame member and covers the pad from above;
   integrally fixing the frame member to the solid-state imaging device with an end of the bonding wire that is connected to the pad covered with the leg portion;
   accommodating a light-transmissive optical member in the frame member in such a way that the optical member faces an imaging surface of the solid-state imaging device;
   applying an adhesive in such a way that the end of the bonding wire that is connected to the pad is covered with the adhesive;
   moving the frame member downward from above the sensor unit, to which the adhesive has been applied, in such a way that the adhesive adheres to the leg portion so that the leg portion is bonded to the pad to which the bonding wire has been connected; and
   allowing the frame member to be fixed to the solid-state imaging device with the adhesive,
   wherein
      the frame member has a protrusion protruding from the leg portion toward the pad,
      the frame member is moved downward from above the sensor unit, to which the adhesive has been applied, in such a way that the frame member covers the sensor unit and the protrusion enters the adhesive to a point where a root of the protrusion comes into contact with the adhesive, and
      the frame member is then moved upward to a predetermined height position so that the adhesive is allowed to cure.

* * * * *